(12) United States Patent
Iwata et al.

(10) Patent No.: US 7,187,588 B2
(45) Date of Patent: Mar. 6, 2007

(54) SEMICONDUCTOR STORAGE

(75) Inventors: Hiroshi Iwata, Ikoma-gun (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 135 days.

(21) Appl. No.: 10/506,322

(22) PCT Filed: Mar. 3, 2003

(86) PCT No.: PCT/JP03/02420

§ 371 (c)(1),
(2), (4) Date: Sep. 2, 2004

(87) PCT Pub. No.: WO03/075358

PCT Pub. Date: Sep. 12, 2003

(65) Prior Publication Data
US 2005/0226044 A1 Oct. 13, 2005

(30) Foreign Application Priority Data
Mar. 5, 2002 (JP) ............................. 2002-058142
Feb. 13, 2003 (JP) ............................. 2003-035280

(51) Int. Cl.
G11C 16/04 (2006.01)

(52) U.S. Cl. ..................... 365/185.28; 365/185.18; 365/185.14; 365/185.05

(58) Field of Classification Search .......... 365/185.28, 365/185.18, 185.14, 185.05
See application file for complete search history.

(56) References Cited

U.S. PATENT DOCUMENTS

| 4,881,108 | A | 11/1989 | Yoshikawa |
| 5,838,041 | A | 11/1998 | Sakagami et al. |
| 6,316,317 | B1 | 11/2001 | Kawata et al. |
| 6,329,247 | B1 | 12/2001 | Ito |
| 6,335,554 | B1 | 1/2002 | Yoshikawa |
| 6,400,610 | B1 * | 6/2002 | Sadd ...................... 365/185.28 |
| 2002/0097621 | A1 * | 7/2002 | Fujiwara ...................... 365/204 |
| 2004/0160828 | A1 | 8/2004 | Iwata et al. |
| 2004/0164359 | A1 | 8/2004 | Iwata et al. |

FOREIGN PATENT DOCUMENTS

| JP | 63-204770 A | 8/1988 |
| JP | 9-116119 A | 5/1997 |
| JP | 2001-230332 A | 8/2001 |
| JP | 2001-512290 A | 8/2001 |
| JP | 2002-164446 A | 6/2002 |
| WO | WO-99/07000 A2 | 2/1999 |

* cited by examiner

*Primary Examiner*—Huan Hoang
(74) *Attorney, Agent, or Firm*—Birch, Stewart, Kolasch & Birch, LLP

(57) ABSTRACT

A semiconductor storage device includes a semiconductor substrate, a gate insulating film formed on the semiconductor substrate, a single gate electrode formed on the gate insulating film, two charge holding portions formed on both sides of the gate electrode, source/drain regions respectively corresponding to the charge holding portions, and a channel region disposed under the single gate electrode. A memory function implemented by these two charge holding portions and a transistor operation function implemented by the gate insulating film is separated from each other for securing sufficient memory function as well as easily suppressing short channel effect by making the gate insulating film thinner.

18 Claims, 22 Drawing Sheets

SEMICONDUCTOR STORAGE

TECHNICAL FIELD

The present invention relates to an operation method of a semiconductor storage device. More specifically, the present invention relates to a semiconductor storage device composed of a field-effect transistor having a function to convert changes of an electric charge amount to a current amount.

BACKGROUND ART

Conventionally, as a nonvolatile memory capable of storing two bits by one field-effect transistor, there has been a memory developed by Saifun Semiconductors Ltd. (refer to Kohyo (Japanese Unexamined Patent Publication) No. 2001-512290 for example). The structure of this prior art memory and the principle of its erase operation will be described hereinbelow.

As shown in FIG. 22 of the present application, this memory is composed of a gate electrode 909 formed on a P type well region 901 through a gate insulating film, and a first N type diffusion layer region 902 and a second N type diffusion layer region 903 formed on the surface of the P type well region 901. The gate insulating film is composed of so-called ONO (Oxide Nitride Oxide) film in which a silicon nitride film 906 is interposed between silicon oxide films 904 and 905. In the silicon nitride film 906, there are formed memory holing portions 907, 908 in the vicinity of the edge portions of the first and second N type diffusion layer regions 902, 903.

An amount of electric charges in each of these memory holing portions 907, 908 is read as a drain current of a transistor so that two-bit information is stored in one transistor.

Next description will be given of an erase operation method in this memory. The term "erase" is used herein to refer to the action of releasing electrons stored in the memory holing portions 907, 908. In Kohyo (Japanese Unexamined Patent Publication) No. 2001-512290, there has been disclosed a method for releasing electrons stored in a right memory holding portion 908 by applying 5.5V to the second diffusion layer region 903 and −8V to the gate electrode 909, and extracting electrons toward the drain electrode. This makes it possible to erase memory of a specific side among two memory holding portions. There has been also disclosed a method for writing onto and reading from a specific side. By combining these methods, two-bit operation is enabled.

However, in the above-stated memory, in order to provide the gate insulating film with the function of operating the transistor as well as the function as a memory film for storing electric charges, the gate insulating film is formed into three-layer structure with use of ONO film. This makes it difficult to manufacture thinner gate insulating films. Also, as the channel length is shortened, these two memory holing portions 907, 908 in one transistor interfere with each other, which makes two-bit operation difficult. This obstacles further miniaturization of the devices.

DISCLOSURE OF THE INVENTION

In view of the above problems, it is an object of the present invention to provide a semiconductor storage device allowing further miniaturization while fulfilling two-bit memory holding in one transistor.

In order to solve the above problems, a semiconductor storage device in a first aspect of the present invention comprises a first conductivity type semiconductor substrate, a first conductivity type well region provided in a semiconductor substrate, or a first conductivity type semiconductor film disposed on an insulator;

a gate insulating film formed on the first conductivity type semiconductor substrate, the first conductivity type well region provided in the semiconductor substrate, or the first conductivity type semiconductor film disposed on the insulator;

a single gate electrode formed on the gate insulating film;

two charge holding portions formed on sides of side walls of the single gate electrode;

a channel region disposed under the single gate electrode; and second conductivity type diffusion layer regions disposed on both sides of the channel region, wherein the charge holding portions are structured so as to change a current amount flowing between one of the second conductivity type diffusion layer regions and the other of the second conductivity type diffusion layer regions when voltage is applied to the gate electrode by an amount of electric charges stored in the charge holding portions, wherein a reference voltage is applied to the other of the second conductivity type diffusion layer regions, a first voltage is applied to the one of the second conductivity type diffusion layer regions, and a second voltage is applied to the gate electrode such that carriers are injected into the charge holding portion existing on the side of the one of the second conductivity type diffusion layer regions.

According to the above structure, the two charge holding portions formed on the both sides of the side wall of the gate electrode are independent of the gate insulating film, so that the memory function implemented by the charge holding portions and the transistor operation function implemented by the gate electrode are separated. Eventually, it is easy to make the gate insulating film thinner and control short channel effect while maintaining sufficient memory function. Also, the two charge holding portions formed on the both sides of the gate electrode are separated by the gate electrode, which enables effective restraint of interference in rewrite operation. In other words, a distance between these two charge holding portions may be shortened.

Further, by appropriately setting the voltage of the gate electrode, the voltage of the one of the second conductivity type diffusion layer regions, and the voltage of the other of the second conductivity type diffusion layer regions, it becomes possible to selectively injecting carriers to the charge holding portion on the side of the one of the second conductivity type diffusion layer regions. This makes it possible to provide a semiconductor storage device enabling two-bit operation and facilitating miniaturization.

Herein, when the first conductivity type is P type, the second conductivity type is N type, and the carriers are positive holes. Contrary to this, when the first conductivity type is N type, the second conductivity type is P type, and the carriers are electrons. Also, when the first voltage is higher than the reference voltage, the second voltage is lower than the reference voltage. When the first voltage is lower than the reference voltage, the second voltage is higher than the reference voltage.

In one embodiment, a third voltage is applied to the first conductivity type semiconductor substrate, the first conductivity type well region provided in the semiconductor substrate, or the first conductivity type semiconductor film disposed on the insulator.

According to the semiconductor storage device in the present embodiment, forward-direction voltage is applied to a PN junction between the other of the second conductivity type diffusion layer regions, and, the first conductivity type semiconductor substrate, the first conductivity type well region provided in the semiconductor substrate, or the first conductivity type semiconductor film disposed on the insulator. As a result, either ones of electrons and positive holes are injected into the semiconductor substrate. The injected electrons or positive holes are accelerated and diffused in the PN junction between the other of the second conductivity type diffusion layer regions, and, the first conductivity type semiconductor substrate, the first conductivity type well region provided in the semiconductor substrate, or the first conductivity type semiconductor film disposed on the insulator, as a result of which pairs of an electron and a positive hole are generated. The others among thus-generated electrons or positive holes are selectively injected as carriers into the charge holding portion existing on the side of the other of the second conductivity type diffusion layer regions. This process also occurs in the case where voltage difference between the other of the second conductivity type diffusion layer regions and the semiconductor substrate is relatively low, which makes it possible to lower the operating voltage of the semiconductor storage device. Therefore, it becomes possible to achieve lower consumption power and the control of device deterioration of the semiconductor storage device.

In one embodiment, the first conductivity type is P type,
the second conductivity type is N type,
the carriers are positive holes,
the first voltage is higher than the reference voltage, and
the second voltage is lower than the reference voltage, and
the third voltage is higher than the reference voltage.

According to the above embodiment, the voltage of the one of the N type diffusion layer regions is set higher than the reference voltage, and the voltage of the gate electrode is set lower than the reference voltage so as to enable selective injection of positive holes into the charge holding portion on the side of the one of the N type diffusion layer regions.

Also, the voltage of the P type semiconductor substrate, the P type well region provided in the semiconductor substrate, or the P type semiconductor film disposed on the insulator is set higher than the reference voltage, so that forward-direction voltage is applied to the PN junction between the P type semiconductor substrate, the P type well region provided in the semiconductor substrate, or the P type semiconductor film disposed on the insulator, and, the other of the N type diffusion layer regions, by which electrons are injected into the semiconductor substrate. The injected electrons are accelerated and diffused in the PN junction between the one of the N type diffusion layer regions, and, the P type semiconductor substrate, the P type well region provided in the semiconductor substrate, or the P type semiconductor film disposed on the insulator, as a result of which pairs of an electron and a positive hole are generated. The positive holes among these are selectively injected into the charge holding portion existing on the side of the one of the N type diffusion layer regions. This process also occurs in the case where voltage difference between the other of the N type diffusion layer regions and the semiconductor substrate is relatively low, which makes it possible to lower the operating voltage of the semiconductor storage device. Therefore, it becomes possible to achieve lower consumption power and the control of device deterioration of the semiconductor storage device.

In one embodiment, the first conductivity type is N type,
the second conductivity type is P type,
the carriers are electrons,
the first voltage is lower than the reference voltage, and
the second voltage is higher than the reference voltage, and
the third voltage is lower than the reference voltage.

According to the above embodiment, the voltage of the one of the P type diffusion layer regions is set lower than the reference voltage, and the voltage of the gate electrode is set higher than the reference voltage so as to enable selective injection of electrons into the charge holding portion existing on the side of the one of the P type diffusion layer regions.

Also, the voltage of the N type semiconductor substrate, the N type well region provided in the semiconductor substrate, or the N type semiconductor film disposed on the insulator is set lower than the reference voltage, so that forward-direction voltage is applied to the PN junction between the N type semiconductor substrate, the N type well region provided in the semiconductor substrate, or the N type semiconductor film disposed on the insulator, and, the other of the P type diffusion layer regions, by which positive holes are injected into the semiconductor substrate. The injected positive holes are accelerated and diffused in the PN junction between the one of the P type diffusion layer regions, and, the N type semiconductor substrate, the N type well region provided in the semiconductor substrate, or the N type semiconductor film disposed on the insulator, as a result of which pairs of an electron and a positive hole are generated. The electrons among these are selectively injected into the charge holding portion existing on the side of the one of the P type diffusion layer regions. This process also occurs in the case where voltage difference between the other of the P type diffusion layer regions and the semiconductor substrate is relatively low, which makes it possible to lower the operating voltage of the semiconductor storage device. Therefore, it becomes possible to achieve lower consumption power and the control of device deterioration of the semiconductor storage device.

In one embodiment, the second conductivity type diffusion layer regions have an offset structure without an overlap region overlapping the gate electrode with interposition of the gate insulating film.

According to the above embodiment, the semiconductor storage device has so-called offset transistor structure, which makes it possible to obtain large memory effect. Since the semiconductor storage device has the offset structure, due to potential of the gate electrode, an effect of promoting generation of either ones of positive holes or electrons is reduced in the PN junction between the one of the second conductivity type diffusion layer regions and the first conductivity type semiconductor substrate or the like. Contrary to this, to the PN junction between the other of the second conductivity type diffusion layer regions and the first conductivity type semiconductor substrate or the like, forward-direction voltage is applied. Eventually with relatively low voltage, in the PN junction between the one of the second conductivity type diffusion layer regions and the first conductivity type semiconductor substrate or the like, the others among positive holes and electrons are generated as carriers to be injected into the charge holding portion existing on the side of the one of the second conductivity type diffusion layer regions. Therefore, it becomes possible to provide a semiconductor storage device having large memory effect and enabling low voltage operation.

In one embodiment, an absolute value of voltage difference between the second voltage and third voltage is 0.7V or more and 1V or less.

According to the above embodiment, there may be obtained forward-current flowing to the PN junction between the other of the second conductivity type diffusion layer regions, and, the first conductivity type semiconductor substrate, the first conductivity type well region provided in the semiconductor substrate, or the first conductivity type semiconductor film disposed on the insulator, that is enough for generating positive holes or electrons as carriers in the PN junction between the one of the second conductivity type diffusion layer regions, and, the first conductivity type semiconductor substrate, the first conductivity type well region provided in the semiconductor substrate, or the first conductivity type semiconductor film disposed on the insulator. Also, the forward-direction current will not cause considerable increase of current consumption in the semiconductor storage device.

Also, in one embodiment, a gate length of the gate electrode is 0.015 μm or more and 0.5 μm or less.

According to the above embodiment, in the PN junction between the one of the second conductivity type diffusion layer regions and the first conductivity type semiconductor substrate or the like, positive holes and electrons are sufficiently generated, which makes it possible to inject them into the charge holding portion. Also, transistor operation, that is the basics of memory operation, may be secured.

Also in one embodiment, the charge holding portion is composed of a first insulator, a second insulator, and a third insulator, the charge holding portion has a structure in which a film composed of the first insulator having a function of storing electric charges is interposed between the second insulator and the third insulator, the first insulator is silicon nitride, and the second and third insulators are silicon oxide.

According to the above embodiment, the first insulator having a function of storing the electric charges is silicon nitride, in which a number of levels for trapping electric charges (electrons and positive holes) are present, so that large hysteresis property may be obtained. Also, since the second and third insulators are silicon oxide, the charge holding portion has so-called NON (Oxide Nitride Oxide) film structure, which increase injection efficiency of electric charges and enables high-speed rewrite operation.

Also in one embodiment, a thickness of the film composed of the second insulator on the channel region is smaller than a thickness of the gate insulating film and is 0.8 nm or more.

According to the above embodiment, the thickness of the film composed of the second insulator that separates the film composed of the first insulator having a function of storing electric charges from the channel region is smaller than the thickness of the gate insulating film and is 0.8 nm or more, which enables decrease of voltage for write operation and erase operation or enables high-speed write operation and erase operation without degrading withstanding voltage capability of the memory, thereby enabling increase of memory effect.

Also in one embodiment, a thickness of the film composed of the second insulator on the channel region is larger than a thickness of the gate insulating film and is 20 nm or less.

According to the above embodiment, the thickness of the film composed of the second insulator that separates the film composed of the first insulator having a function of storing electric charges from the channel region is larger than the thickness of the gate insulating film and is 20 nm or less, which enables improvement of holding characteristics without worsening short channel effect of the memory.

Also in one embodiment, the film composed of the first insulator having a function of storing electric charges includes a portion having a surface that is approximately parallel to a surface of the gate insulating film.

According to the above embodiment, it becomes possible to increase a rewrite speed while preventing deterioration of electric charge holding characteristics of the semiconductor storage device.

Also in one embodiment, the film composed of the first insulator having a function of storing electric charges includes a portion extending in direction approximately parallel to a lateral side of the gate electrode.

According to the above embodiment, the film composed of the first insulator having a function of storing electric charges includes a portion extending in direction approximately parallel to a lateral side of the gate electrode so that an electric charge amount injected into the film composed of the first insulator having a function of storing electric charges in rewrite operation is increased and high-speed write operation is enabled.

Also in one embodiment, at least part of the charge holding portion is formed so as to overlap part of the second conductivity type diffusion layer region.

According to the above embodiment, it becomes possible to increase read current of the semiconductor storage device and to restrain dispersion of the read current, thereby enabling high-speed read operation of the semiconductor storage device.

BEST MODE FOR CARRYING OUT THE INVENTION

Figure 1:
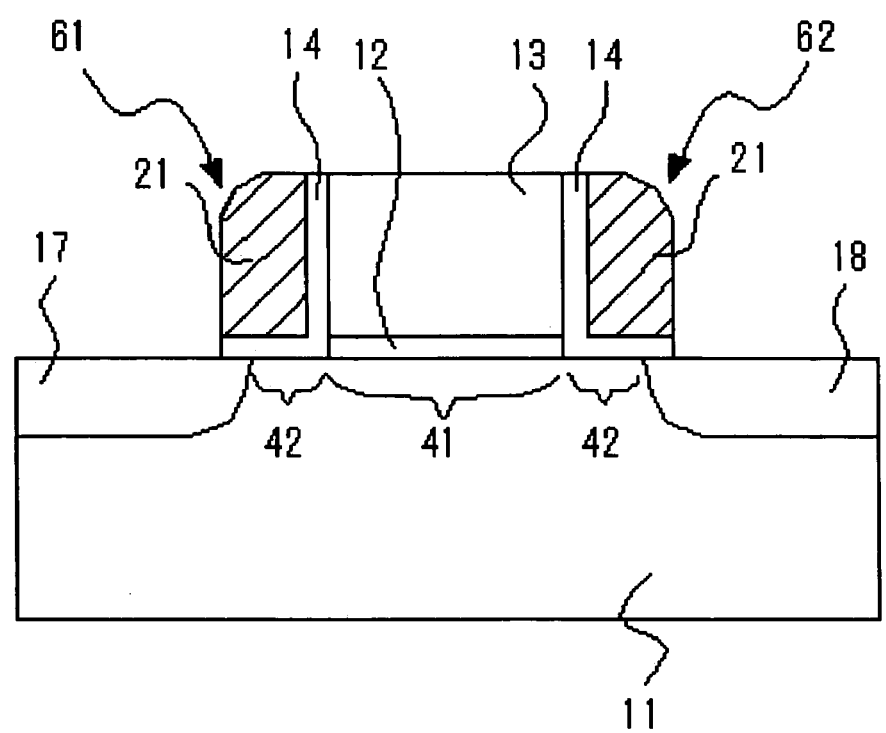
FIG. 1 is an outlined cross sectional view showing main part of a first example of the semiconductor storage device in a first embodiment of the present invention.

A semiconductor storage device of the present invention is mainly composed of a gate insulating film, a gate electrode formed on the gate insulating film, a charge holding portion formed on the both sides of the gate electrode, source/drain regions (diffusion layer regions) disposed separately on the side of the charge holding portion opposed to the gate electrode, and a channel region disposed under the gate electrode.

The semiconductor storage device functions as a memory device storing four-valued or more information by storing binary or more information in one charge holding portion. However, the semiconductor storage device functions not necessarily to store four-valued or more information, but it may also functions to store, for example, binary information.

It is preferable that the semiconductor storage device of the present invention is formed on a semiconductor substrate, preferably on a first conductivity type well region formed in the semiconductor substrate.

Examples of the semiconductor substrate are not particularly limited and include those for use in semiconductor apparatuses, such as substrates made from elemental semiconductors including silicon and germanium, substrates made from compound semiconductors including GaAs, InGaAs and ZnSc, various substrates including SOI substrates and multilayer SOI substrates, and substrates having a semiconductor layer on a glass and plastic substrate.

Among these, a silicon substrate or SOI substrate having a silicon layer formed as a surface semiconductor layer is preferable. The semiconductor substrate or the semiconductor layer may be either single crystal (e.g., single crystal obtained by epitaxial growth), multi-crystal, or amorphous, though a current amount flowing inside will change.

On the semiconductor substrate or the semiconductor layer, it is preferable that a device isolation region is formed, and it is more preferable to combine a device such as transistors, capacitors and resists, a circuit composed thereof, a semiconductor device, and an inter-layer insulating film to form a single or a multilayer structure. It is noted that the device isolation region may be formed with various device isolation films including LOCOS films, trench oxide films, and STI films. The semiconductor substrate may have either P type or N type conductivity type, and it is preferable that at least one first conductivity type (P type or N type) well region is formed on the semiconductor substrate. Acceptable impurity concentration of the semiconductor substrate and the well region is those within the known range in the art. It is noted that in the case of using SOI substrate as the semiconductor substrate, a well region may be formed in the surface semiconductor layer, and also a body region may be provided under the channel region.

Examples of the gate insulating film are not particularly limited and include those for use in typical semiconductor apparatuses, such as: insulating films including silicon oxide films and silicon nitride films; and high-dielectric films including aluminum oxide films, titanium oxide films, tantalum oxide films, hafnium oxide films, in the form of single-layer films or multi-layer films. Among these, the silicon oxide film is preferable. An appropriate thickness of the gate insulating film is, for example, approx. 1 to 20 nm, preferably 1 to 6 nm. The gate insulating film may be only formed right under the gate electrode, and may be formed to be larger (in width) than the gate electrode.

The gate electrode is formed on the gate insulating film in the form typically used in semiconductor apparatuses. Unless particularly specified in the embodiment, examples of the gate electrode are not particularly limited and therefore include such conductive films as: polysilicon; metals including copper and aluminum; high-melting metals including tungsten, titanium, and tantalum; and high-melting metals and silicide in the form of a single-layer or a multi-layer. An appropriate film thickness of the gate electrode is approx. 50 to 400 nm. It is noted that under the gate electrode, a channel region is formed, though the channel region is preferably formed not only under the gate electrode but also under the region including the gate electrode and the outside of the gate edge in longitudinal direction of the gate. Thus, in the case where there is present a channel region which is not covered with the gate electrode, the channel region is preferably covered with the gate insulating film or a later-described charge holding portion.

The charge holding portion at least includes a film or a region having a function of holding electric charges or storing and holding electric charges, or a function of trapping electric charges. Articles implementing these functions include: silicon nitride; silicon; silicate glass including impurities such as phosphorus and boron; silicon carbide; alumina; high-dielectric substances such as hafnium oxide, zirconium oxide, tantalum oxide; zinc oxide; and metals. The charge holding portion may be formed into single-layer or multi-layer structure with: for example, an insulating film containing a silicon oxide film; an insulating film containing a conductive film or a semiconductor layer inside; and an insulating film containing one or more semiconductors or semiconductor dots. Among these, the silicon oxide is preferable because it may achieve large hysteresis property by the presence of a number of levels for trapping electric charges, and has good holding characteristics since long electric-charge holding time prevents electric charges from leaking due to generation of leakage pas, and further because it is a material normally used in LSI process.

Use of an insulating film containing inside an insulating film having a charge holding function such as silicon nitride films enables increase of reliability relating to memory holding. Since the silicon nitride film is an insulator, electric charges of the entire silicon nitride film will not be immediately lost even if part of the electric charges is leaked. Further, in the case of arraying a plurality of memory devices (semiconductor storage devices), even if the distance between the memory devices is shortened and adjacent charge holding portions come into contact with each other, information stored in each charge holding portion is not lost unlike the case where the charge holding portion is made from a conductor. Also, it becomes possible to dispose a contact plug closer to the charge holding portion, or in some cases it becomes possible to dispose the contact plug so as to overlap with the charge holding portion, which facilitates miniaturization of the memory devices.

For further increase of the reliability relating to the memory holding, an insulating film having a function of holding electric charges is not necessarily in the film shape, and an insulator having the function of holding an electric charge is preferably present in the insulating film in a discrete manner. More specifically, it is preferable that an insulator is dispersed like dots over a material having difficulty in holding electric charges, such as silicon oxide.

Also, use of an insulator film containing inside a conductive film or a conductor layer as a charge holding portion enables free control of quantity of electric charges injected into the conductor or the semiconductor, thereby bringing about an effect of facilitating achieving multi level cell.

Further, using an insulator film containing one or more conductors or semiconductor dots as a charge holding portion facilitates execution of write and erase due to direct tunneling of electric charges, thereby bringing about an effect of reduced power consumption.

More specifically, it is preferable that the charge holding portion further contains a film having a region that obstructs escape of electric charges or a function of obstructing escape of electric charges. Those fulfilling the function of obstructing escape of electric charges include a silicon oxide.

The charge holding portion is formed on the both sides of the gate electrode directly or through an insulating film, and it is directly disposed on a semiconductor substrate (a well region, a body region, or a source/drain region or a diffusion layer region) through the gate insulating film or the insulating film. A charge holding film on the both sides of the gate electrode may be formed so as to cover the entire side walls of the gate electrode directly or thought he insulating film, or it may be formed so as to cover part thereof. In the case of using a conductive film as the charge holding film, the charge holding film is preferably disposed through an insulating film so that the charge holding film is not brought into direct contact with a semiconductor substrate (a well region, a body region, or a source/drain region or a diffusion layer region) or the gate electrode. This is implemented by, for example, a multi-layer structure composed of a conductive film and an insulating film, a structure of dispersing a conductive film like dots in an insulating film, and a structure of disposing a conductive film within part of a side-wall insulating film formed on the side wall of the gate.

The charge holding portion preferably has a sandwich structure in which a film made of a first insulator for storing electric charges is interposed in between a film made of a second insulator and a film made of a third insulator. Since the first insulator for storing electric charges is in the film shape, it becomes possible to increase electric charge concentration in the first insulator in a short period of time by injection of electric charges and also to uniform the electric charge concentration. In the case where the electric charge distribution in the first insulator for storing electric charges is not uniform, there is a possibility that electric charges move inside the first insulator during being held and so the reliability of the memory devices is deteriorated. Also, the first insulator for storing electric charges is separated from a conductor portion (a gate electrode, a diffusion layer region, and a semiconductor substrate) with other insulating film, which may restrain leakage of electric charges and makes it possible to obtain sufficient holding time. Therefore, the above sandwich structure enables high-speed rewrite operation, increased reliability, and obtainment of sufficient holding time of the semiconductor storage device. The charge holding portion that fulfils the above conditions is more preferably structured such that the first insulator is to be a silicon nitride film, and the second and the third insulators are to be silicon oxide films. The silicon nitride film may achieve large hysteresis property by the presence of a number of levels for trapping electric charges. Also, the silicon oxide film as well as the silicon nitride film are preferable because they are materials used in LSI process quite normally. Further, as the first insulator, in addition to silicon nitride, there may be used such materials as hafnium oxide, tantalum oxide, and yttrium oxide. As the second and third insulators, in addition to the silicon oxide, such material as aluminum oxide may be used. It is noted that the second and third insulators may be different materials or may be the same material.

The charge holding portion is formed on the both sides of the gate electrode, and disposed on a semiconductor substrate (a well region, a body region, or a source/drain region or a diffusion layer region).

The charge holding film contained in the charge holding portion is formed on the both sides of the gate electrode directly or through an insulating film, and it is directly disposed on a semiconductor substrate (a well region, a body region, or a source/drain region or a diffusion layer region) through the gate insulating film or the insulating film. A charge holding film on the both sides of the gate electrode is preferably formed so as to cover all or part of side walls of the gate electrode directly or thought the insulating film. In the case where the gate electrode has a recess portion on the lower edge side as an application example, the charge holding film may be formed so as to fill the entire recess portion or part of the recess portion directly or through the insulating film.

Preferably, the gate electrode is formed only on the side wall of the charge holding portion or formed such that the upper portion of the charge holding portion is not covered. In such disposition, it becomes possible to dispose a contact plug closer to the gate electrode, which facilitates miniaturization of the memory devices. Also, the memory devices having such simple disposition are easily manufactured, resulting in an increased yield.

The source/drain region is separately disposed on the side of the charge holding portion opposed to the gate electrode as a diffusion layer region having a conductivity type opposite to that of a semiconductor substrate or a well region. In the portion where the source/drain region is joined to the semiconductor substrate or the well region, impurity concentration is preferably sharp. This is because the sharp impurity concentration efficiently generate hot electrons and hot positive holes with low voltages, which enables high-speed operation with lower voltages. The junction depth of the source/drain region is not particularly limited and so it is adjustable where necessary corresponding to performance and the like of a semiconductor storage device to be manufactured. It is noted that if SOI substrate is used as a semiconductor substrate, the junction depth of the source/drain region may be smaller than the film thickness of a surface semiconductor layer, though preferably the junction depth is almost equal to the film thickness of the surface semiconductor layer.

The source/drain region may be disposed so as to be overlapped with the edge of the gate electrode, or may be disposed so as to be offset from the edge of the gate electrode. Particularly, it is preferable that the source/drain region is offset from the edge of the gate electrode. This is because in this case, when voltage is applied to the gate electrode, easiness of inversion of the offset region under the charge holding film is largely changed by an electric charge amount stored in the charge holding portion, resulting in increased memory effect and reduced short channel effect. It is noted, however, that too much offset extremely reduces drive current between the source and the drain. Therefore, it is preferable that an offset amount, that is a distance from one edge of the gate electrode to the source or drain region closer thereto in the longitudinal direction of the gate, is shorter than the thickness of the charge holding film parallel to the longitudinal direction of the gate. What is particularly important is that at least part of the electric charge storage region in the charge holding portion overlaps with part of the source/drain region as a diffusion layer region. This is because the nature of memory devices constituting the semiconductor storage devices of the present invention is to rewrite memory with an electric field crossing the charge holding portion by voltage difference between the gate electrode present only on the side wall portion of the charge holding portion and the source/drain region.

Part of the source/drain region may be extensively provided in the position higher than the surface of the channel region, that is, the lower face of the gate insulating film. In this case, it is appropriate that a conductive film integrated with the source/drain region is laminated on the source/drain region formed in the semiconductor substrate. Examples of the conductive film include semiconductors such as polysilicon and amorphous silicon, silicide, the above described metals, and high-melting metals. Among these, the polysilicon is preferable. Since the polysilicon is extremely larger in impurity diffusion speed than the semiconductor substrate, it is easy to shallow the junction depth of the source/drain region in the semiconductor substrate, and it is easy to control short channel effect. In this case, it is preferable that the source/drain region is disposed such that at least part of the charge holding film is interposed in between part of the source/drain region and the gate electrode.

The semiconductor storage device of the present invention uses a single gate electrode formed on the gate insulating film, a source region, a drain region, and a semiconductor substrate as four terminals, and executes write, erase and read operations by giving specified potential to each of these four terminals. An example of specific operation principle and operation voltage will be described later. When the semiconductor storage devices of the present invention are disposed in an array to constitute a memory cell array, a single control gate is capable of control each memory cell, which makes it possible to decrease the number of word lines.

The semiconductor storage device of the present invention may be formed in a normal semiconductor process by a method similar to, for example, a method for forming a multilayer-structured side wall spacer on the side wall of a gate electrode. More specifically, there is a method in which after the gate electrode is formed, a multilayer composed of an insulating film (second insulator), an electric charge storage film (first insulator), and an insulating film (second insulator) is formed and etched back under an appropriate condition to leave the film in the form of a side wall spacer. In addition, corresponding to the structure of a desired charge holding portion, conditions and deposits in forming the side wall may be appropriately selected.

The semiconductor storage device of the present invention is applicable to portable electronic apparatuses and more particularly to portable information terminals. Examples of the portable electronic apparatuses include portable information terminals, cell phones, and gaming devices.

Hereinbelow, a semiconductor storage device of the present invention will be described in detail with reference to drawings.

(First Embodiment)

Figure 2:
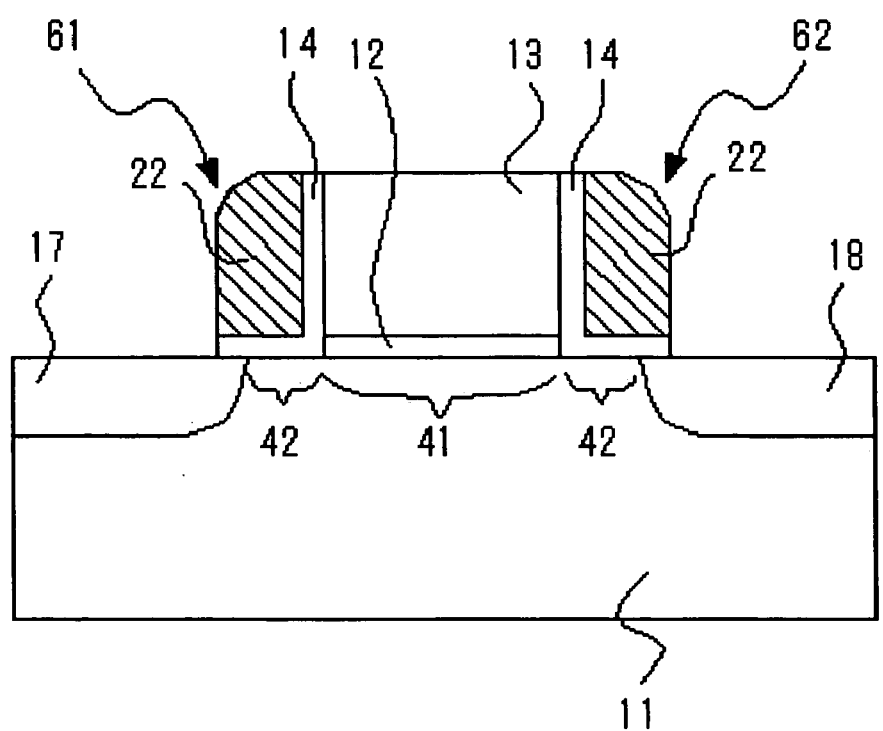
FIG. 2 is an outlined cross sectional view showing main part of a second example of the semiconductor storage device in the first embodiment of the present invention.
Figure 3:
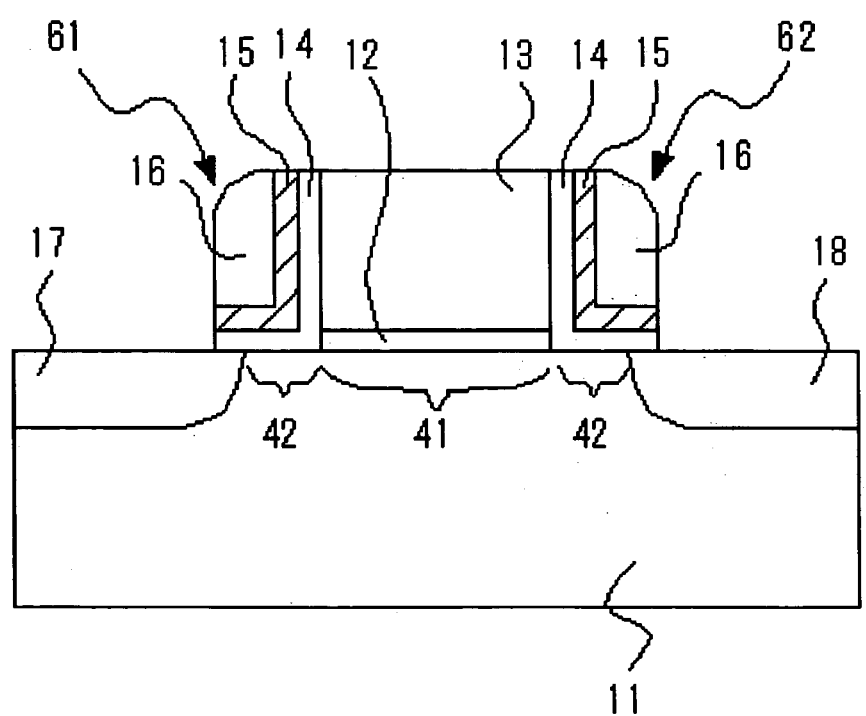
FIG. 3 is an outlined cross sectional view showing main part of a third example of the semiconductor storage device in the first embodiment of the present invention.

The structure of a memory device constituting a semiconductor storage device of the present embodiment will be described with reference to FIGS. 1 to 3. FIGS. 1 to 3 are outlined cross sectional views showing memory devices whose structure of a charge holding portion in the shape of side wall spacer is different from each other.

The memory device constituting the semiconductor storage device of the present embodiment is formed as a nonvolatile memory cell capable of storing two bits, in which, as shown in FIGS. 1 to 3, a gate electrode 13 having a gate length similar to normal transistors is formed on a semiconductor substrate 11 through a gate insulating film 12, and charge holding portions 61, 62 in the shape of side wall spacer are formed on the side walls of the gate insulating film 12 and the gate electrode 13. On the side of the charge holding portions 61, 62 facing the gate electrode 13, there are formed a first diffusion layer region 17 and a second diffusion layer region 18 (source/drain regions). The source/drain regions 17, 18 are offset from the edge portion of the gate electrode 13 (from a region 41 where the gate electrode 13 is formed).

Thus, the charge holding portions of the memory transistor are formed independently of the gate insulating film. Consequently, a memory function implemented by the charge holding portions and a transistor operation function implemented by the gate insulating film are separated. Since two charge holding portions formed on the both sides of the gate electrode are separated by the gate electrode, interference in rewrite operation is effectively controlled. Therefore, the memory transistor is capable of storing two bits information and enables easy miniaturization.

Further, since the source/drain regions 17, 18 are offset from the gate electrode 13, easiness of inversion of an offset region 42 under the charge holding film is largely changed by an electric charge amount stored in the charge holding portion when voltage is applied to the gate electrode, which enables increase of memory effect. Further, compared to normal logic transistors, short channel effect may be strongly prevented, which enables further miniaturization of the gate length. Also, since the memory transistor is structurally suitable for controlling the short channel effect, it becomes possible to adopt a gate insulating film with a large film thickness compared to logic transistors, thereby enabling increase of reliability.

The charge holding portion in the shape of side wall spacer may be composed of, as shown in FIG. 1 for example, a silicon nitride film 21 in the shape of side wall and a silicon oxide film 14 for separating the silicon nitride film 21 from the gate electrode 13, the semiconductor substrate 11, and the source/drain regions 17, 18. It is the silicon nitride film 21 that has a function of storing electric charges (electrons or positive holes), and the silicon oxide film 14 prevents the electric charges stored in the silicon nitride film 21 from leaking.

As shown in FIG. 2, another example of the charge holding portion is composed of a conductive film 22 in the shape of side wall and a silicon oxide film 14 for separating the conductive film 22 from the gate electrode 13, the semiconductor substrate 11, and the source/drain regions 17, 18. It is the conductive film 22 that has a function of storing electric charges, and the silicon oxide film 14 prevents the electric charges stored in the conductive film 22 from leaking.

The charge holding portion may further has a structure shown in FIG. 3. The charge holding portion in the shape of side wall spacer has a structure in which a silicon nitride film 15 is interposed in between silicon oxide films 14, 16. The silicon nitride film 15 has a function of trapping and storing electric charges (electrons or positive holes). Storing of electric charges is mainly implemented by a portion present on the offset region 42. Since the charge holding portion has a structure in which the silicon nitride film 15 is interposed in between the silicon oxide films 14, 16 as shown above, efficiency of injecting electric charges into the charge holding portion is increased and high-speed rewrite operation (write and erase operation) is enabled.

The structure of the charge holding portion is not limited to the above three examples (FIGS. 1 to 3), and therefore such structure as containing quantum dots having a function of storing electric charges in the charge holding portion is also acceptable. Also, the charge holding portion does not need to have a side wall shape, as long as the charge holding portion is in the both sides of the gate electrode and part thereof is in contact with the semiconductor substrate 11 and the source/drain regions 17, 18.

Figure 5:
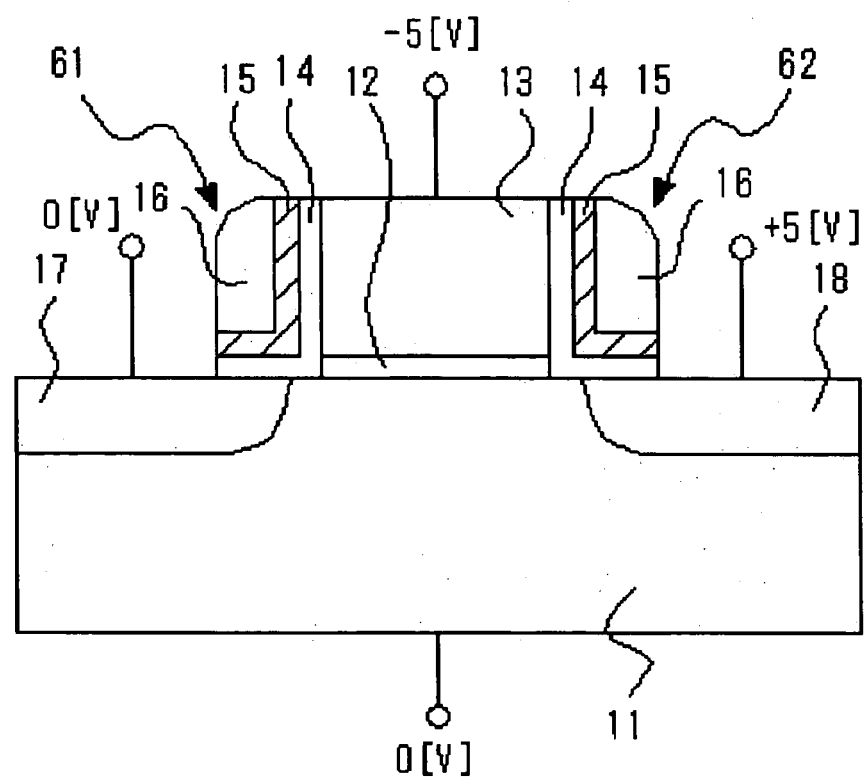
FIG. 5 is an outlined cross sectional view showing main part of the semiconductor storage device of the present invention for describing first erase operation thereof.
Figure 6:
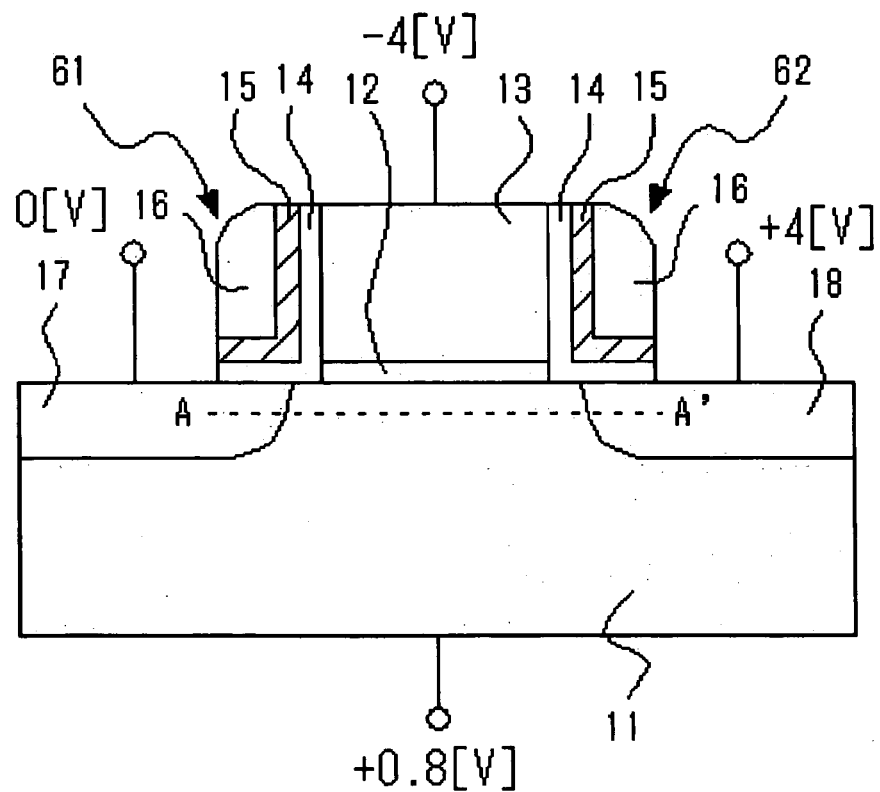
FIG. 6 is an outlined cross sectional view showing main part of the semiconductor storage device of the present invention for describing second erase operation thereof.

Next, the operation principle of the memory device will be described with reference to FIGS. 4 to 8. It is noted that although FIGS. 4 to 6 show memory devices having the charge holding portion shown in FIG. 3, the operation principle is applicable to memory devices having charge holding portions in other shapes.

First, description will be given of write operation of the memory device with reference to FIG. 4. It is noted that the term "write" refers to the action of injecting electrons into the charge holding portion when the memory device is N channel type, and to the action of injecting positive holes into the charge holding portion when the memory device is P channel type. When the memory device is N channel type, the first conductivity type semiconductor substrate 11 is P type and second conductivity type diffusion layer regions 17, 18 are N type. When the memory device is P channel type, conductivity type of each component is reversed. In the following description (including description about read method an erase method), there is shown the case where the memory device is N channel type. As for the case of P channel type, reversing the function of electrons and positive holes will do. Also in the case of P channel type, all the marks of voltages to be applied to each node may be reversed. The write operation of the memory is executed by injecting hot electrons accelerated by drain electric fields into the charge holding portion.

Figure 4A:
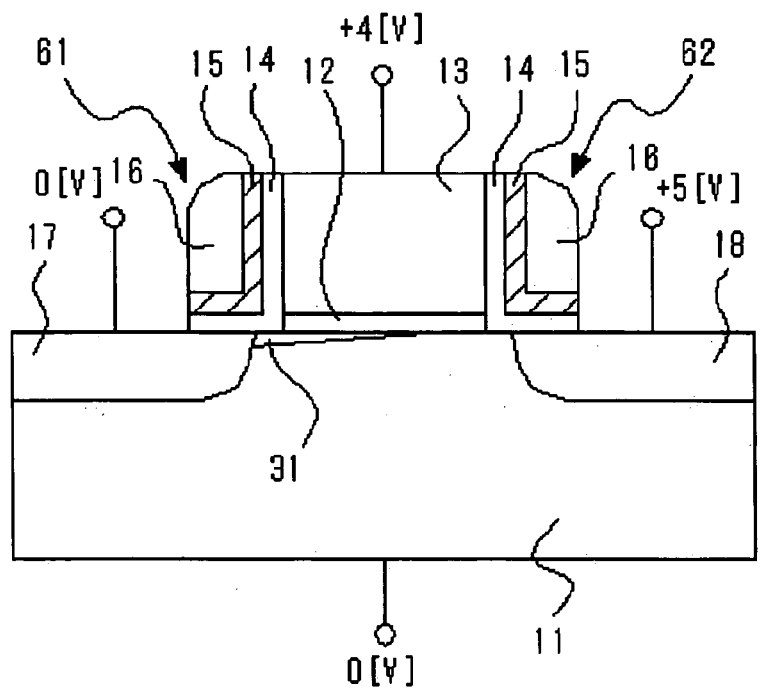
FIGS. 4A and 4B are outlined cross sectional views showing main part of the semiconductor storage device of the present invention for describing write operation thereof.

In order to inject electrons (write) into a second charge holding portion 62, as shown in FIG. 4A, a first diffusion layer region 17 is set to be a source electrode and a second diffusion layer region 18 is set to be a drain electrode. For example, there may be applied 0V to the first diffusion layer region 17 and the semiconductor substrate 11, +5V to the second diffusion layer region 18, and +4V to a gate electrode 13. Under these voltage conditions, an inversion layer 31 extends from the diffusion layer region 17 (source electrode) but fails to reach the second diffusion layer region 18 (drain electrode), resulting in generating a pinchoff point. Electrons are accelerated by high electric fields from the pinchoff point to the second diffusion layer region 18 (drain electrode) and turn to be so-called hot electrons (high energy conductive electrons). By injecting these hot electrons into the second charge holding portion 62 (more precisely the silicon nitride film 15), write operation is executed. It is noted that in the vicinity of a first charge holding portion 61, hot electrons are not generated and therefore write operation is not executed. Thus, electrons are injected to the second charge holding portion 62 so as to enable write operation.

Figure 4B:
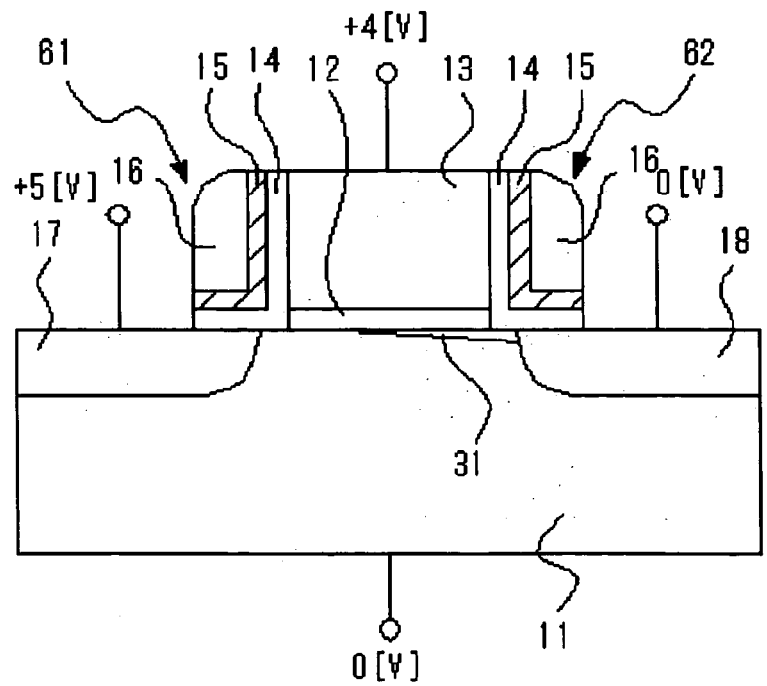

In order to inject electrons (write) into the first charge holding portion 61, as shown in FIG. 4B, the second diffusion layer region 18 is set to be a source electrode, and the first diffusion layer region 17 is set to be a drain electrode. For example, there may be applied 0V to the second diffusion layer region 18 and the semiconductor substrate 11, +5V to the first diffusion layer region 17, and +4V to the gate electrode 13. Thus, by reversing the source and drain regions in the case of injecting electrons into the second charge holding portion 62, electrons are injected into the first charge holding portion 61 for enabling write operation.

Next, description will be given of the principle of read operation of the memory device (unshown).

In the case of reading information stored in the first charge holding portion 61, the first diffusion layer region 17 is set to be a source electrode and the second diffusion layer region 18 is set to be a drain electrode, and a transistor is operated in the saturated region. For example, there may be applied 0V to the first diffusion layer region 17 and the semiconductor substrate 11, +2V to the second diffusion layer region 18, and +1 to the gate electrode 13. Herein, if no electron is stored in the first charge holding portion 61, drain current tends to flow. In the case where electrons are stored in the first charge holding portion 61, an inversion layer is hardly formed in the vicinity of the first charge holding portion 61, and so the drain current does not tend to flow. Therefore, detecting the drain current makes it possible to read information stored in the first charge holding portion 61. Here, whether or not electric charges are stored in the second charge holding portion 62 does not affect the drain current since the vicinity of the drain is pinched off.

In the case of reading information stored in the second charge holding portion 62, the second diffusion layer region 18 is set to be a source electrode, and the first diffusion layer region 17 is set to be a drain electrode, and a transistor is operated in the saturated region. For example, there may be applied 0V to the second diffusion layer region 18 and the semiconductor substrate 11, +2V to the first diffusion layer region 17, and +1V is applied to the gate electrode 13. Thus, by reversing the source and drain regions in the case of reading information stored in the first charge holding portion 61, information stored in the second charge holding portion 62 may be read.

It is noted that if a channel region (offset region 41, 42) not covered with the gate electrode 13 is remained, the presence of excessive electrons in the charge holding portions 61, 62 eliminates or forms the inversion layer in the channel region not covered with the gate electrode 13, as a result of which large hysteresis (change of threshold) may be obtained. However, if the width of the offset region 42 is too large, the drain current is drastically reduced, thereby causing considerable delay of a read speed. Therefore, it is preferable to determine the width of the offset region 42 so as to enable obtainment of sufficient hysteresis and read speed.

In the case where the diffusion layer regions 17, 18 reach the edge of the gate electrode 13, that is, if the diffusion layer regions 17, 18 and the gate electrode 13 are overlapped, write operation causes almost no change to a threshold of the transistor, though parasitic resistance at the edge of the source/drain regions suffers considerable change, resulting in remarkable reduction of the drain current (one digit or more). Therefore, detection of the drain current enables read operation and provides a function as a memory. However, if larger memory hysteresis effect is required, it is preferable that the diffusion layer regions 17, 18 and the gate electrode 13 are not overlapped (that the offset region 42 is present).

Next, description will be given of a first erase method of the semiconductor storage device with reference to FIG. 5.

In the case of erasing information stored in the second charge holding portion 62, a positive voltage (e.g., +5V) is applied to the second diffusion layer region 18 as the one of the second conductivity type diffusion layer regions, while at the same time, 0V is applied to the semiconductor substrate 11, so that reverse bias is imparted to the PN junction between the second diffusion layer region 18 and the semiconductor substrate 11. Further, a negative voltage (e.g., −5V) is applied to the gate electrode 13. Here, in the vicinity of the gate electrode 13 among the PN junction area, potential gradient becomes particularly steep because of the influence of the gate electrode to which a negative voltage is applied. Consequently, positive holes are generated on the side of the semiconductor substrate 11 in the PN junction area due to interband tunneling. The positive holes are pulled toward the gate electrode 13 having negative potential, as a result of which positive holes are injected into the second charge holding portion 62. Thus, erase operation of the second charge holding portion 62 is performed. In this point, 0V may be applied to the first diffusion layer region 17 as the other of the second conductivity type diffusion layer regions, or the first diffusion layer region 17 may be put into open state.

In the above erase method, for erasing information stored in the first charge holding portion 61, potential of the first diffusion layer region and the second diffusion layer region may be reversed.

Next, description will be given of a second erase method of the semiconductor storage device with reference to FIGS. 6 and 7.

In the case of erasing information stored in the second charge holding portion 62, as shown in FIG. 6, there may be applied a positive voltage (e.g., +4V) to the second diffusion layer region 18 as the one of the second conductivity type diffusion layer regions, 0V to the first diffusion layer region 17 as the other of the second conductivity type diffusion layer regions, a negative voltage (e.g., −4V) to the gate electrode 13, and a positive voltage (e.g., +0.8V) to the semiconductor substrate 11. More particularly, with the voltage of the other of the N type diffusion layer regions (first diffusion layer region 17) being used as a reference voltage, the voltage of the one of the N type diffusion layer regions (second diffusion layer region 18) is set higher than the reference voltage, the voltage of the gate electrode 13 is set lower than the reference voltage, and the voltage of a semiconductor substrate of P type as a first conductivity type (semiconductor substrate 11) is set higher than the reference voltage. It is noted that voltages applied to each node are relative. Consequently, if the voltage of the semiconductor substrate 11 is a reference voltage (0V), the above condition is equivalent to the condition in which the voltage of the second diffusion layer region 18 is +3.2V, the voltage of the first diffusion layer region 17 is −0.8V, and the voltage of the gate electrode 13 is −4.8V. In other words, the voltage of the first conductivity type semiconductor substrate (P type semiconductor substrate 11) is set to be a reference voltage, the voltage of the other of the second conductivity type regions (first N type diffusion layer region 17) is set lower than the reference voltage, the voltage of the one of the second conductivity type diffusion layer regions (second N type diffusion layer region 18) is set higher than the reference voltage, and the voltage of the gate electrode 13 is set lower than the reference voltage.

In the case of disposing the semiconductor storage devices of the present embodiment in a cell array, it is preferable to use a P type semiconductor storage device common to each memory device (more specifically, a memory cell array is formed on one semiconductor substrate, or a common P type well region is formed in a semiconductor substrate and a memory cell array is formed thereon), and to fix potential of the P type semiconductor substrate in operating the semiconductor storage devices. This is because since the common P type semiconductor substrate has a PN junction whose area is extremely large, fluctuating the potential of the P type semiconductor substrate generates large current flow in filling the capacity of this PN junction.

Figure 7A:
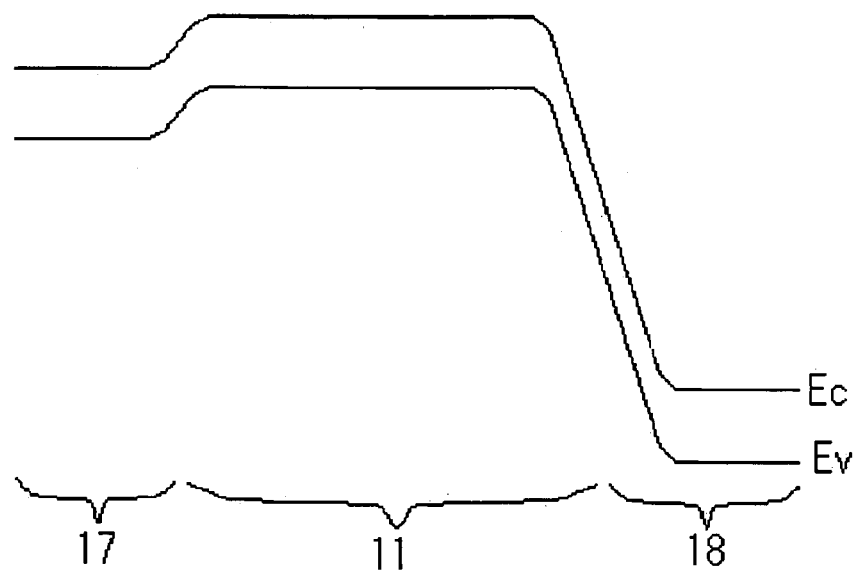
FIGS. 7A and 7B are energy diagrams against electrons in cross sectional line A–A' of FIG. 6.
Figure 7B:
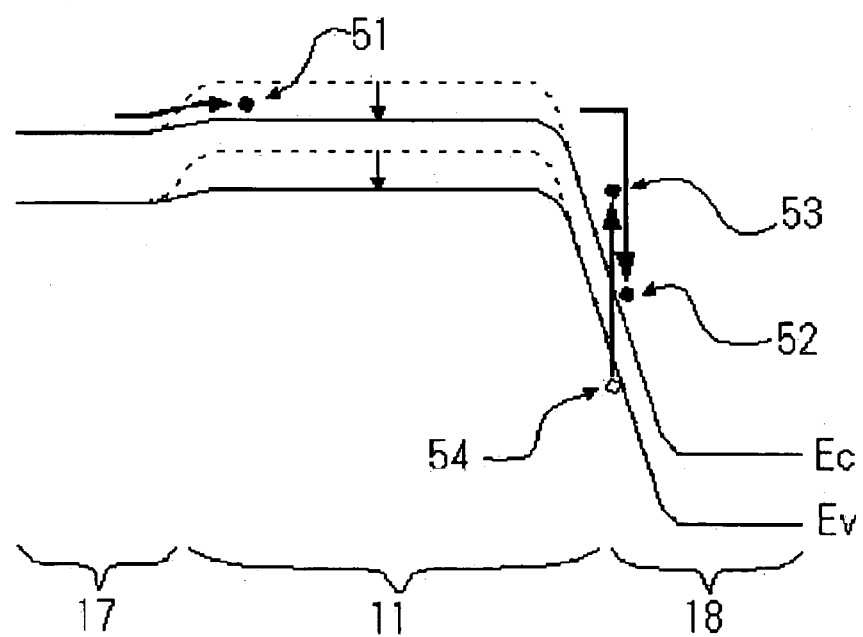

FIGS. 7A and 7B show energy diagrams (energy band diagrams) against electrons in cross sectional line A–A' of FIG. 6. FIG. 7A shows the energy band when 0V that is the same voltage as the first diffusion layer region 17 is applied to the semiconductor substrate 11 (potential of other nodes is similar to that of FIG. 6), while FIG. 7B shows the energy band when +0.8V is applied to the semiconductor substrate 11 (that is the same condition as that shown in FIG. 6). In FIGS. 7A and 7B, Ec represents a conduction electron band edge and Ev represents valence band edge. A gap between Ec and Ev shows a band gap.

In the case of FIG. 7A, though absolute values of voltages are different, the energy band is essentially the same as that in the first erase method. In this case, between the semiconductor substrate 11 and the second diffusion layer region 18, there should be given potential different enough for causing interband tunneling. The second erase method is for generating positive holes and executing erase operation even if potential difference between the semiconductor substrate 11 and the second diffusion layer region 18 is not enough for causing interband tunneling. The most important point in the second erase method is to apply forward-direction voltage to the PN junction between the first diffusion layer region 17 and the semiconductor substrate 11. As shown in FIG. 7B, if the forward-direction voltage is applied, potential of the semiconductor substrate 11 is declined from a dotted line to a solid line. Eventually, electrons are injected from the first diffusion layer region 17 to the semiconductor substrate 11

(electron 51). The electron 51 injected to the semiconductor substrate reaches the PN junction between the second diffusion layer region 18 and the semiconductor substrate 11, where the electron 51 is accelerated by electric fields and loses energy by diffusion (electron 52). The energy lost at this point is received by valence band electrons, resulting in generation of pairs of an electron 53 and a positive hole 54. Thus, in the PN junction between the second diffusion layer region 18 and the semiconductor substrate 11, positive holes are generated, and they are further injected into the second charge holding portion 62, by which erase operation works.

According to the second erase method, it becomes possible to generate positive holes and to perform erase operation even if backward-direction bias applied to the second diffusion layer region 18 and the semiconductor substrate 11 is relatively small. This makes it possible to lower operating voltage of memory devices. Therefore, it becomes possible to fulfill reduced power consumption and restrained deterioration of memory devices. Particularly when the offset region 42 is present, the effect that the gate electrode to which negative potential is applied makes potential of the PN junction steep becomes small. This makes generation of positive holes by interband tunneling difficult. The second erase method covers this defect and fulfils erase operation with low voltage. Therefore, in the memory device of the present invention in which providing the offset region 42 increases memory effect, the second erase method is particularly preferable.

When forward-direction bias applied to between the first diffusion layer region 17 and the semiconductor substrate 11 is 0.7V or more, erase operation is performed, whereas the forward-direction bias is less than 0.7V, erase operation is not performed at all. When the forward-direction bias exceeds 1V, forward-direction current increases and therefore current consumed in erase operation shows considerable increase. Therefore, the forward-direction bias is preferably 0.7V or more and 1V or less.

In the above second erase method, for erasing information stored in the first charge holding portion 61, potential of the first diffusion layer region and potential of the second diffusion layer region may be reversed.

Figure 8:
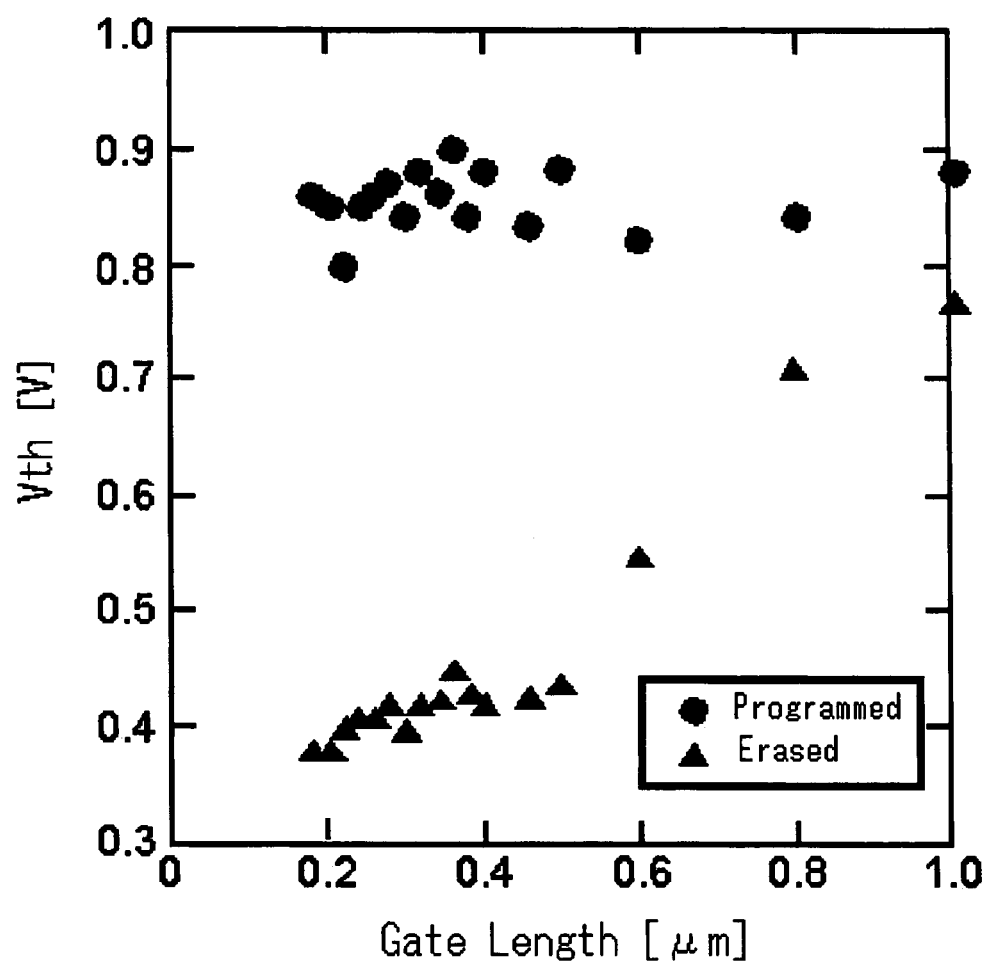
FIG. 8 is a graph showing change of erase capability along with change of gate length in the second erase method of the semiconductor storage device of the present invention.

FIG. 8 is a view showing change of erase capability along with change of the gate length in the second erase method. In an experiment for creating FIG. 8, a threshold value of a memory device was measured after write operation was conducted onto the memory device, and then an threshold value was re-measured after erase operation by the second erase method was conducted. An initial threshold value before conducting write operation was approx. 0.4V. After write operation was conducted, the threshold value incremented to almost the same level (0.85V) regardless of the gate length. It was found out that after erase operation was conducted, the threshold value was lowered to almost the same level (0.4V) when the gate length was 0.5 µm or less, but the erase capability was rapidly decreased along with increase of the gate length when the gate length was 0.6 µm or more. Such phenomenon may be attributed to the following. In FIG. 7B, the electron 51 injected from the first diffusion layer region 17 into the semiconductor substrate 11 can reach the PN junction between the second diffusion layer region 18 and the semiconductor substrate 11 when the gate length (channel length) is sufficiently short. However, when the gate length (channel length) is long, the electron 51 is lost due to recombination or receives repulsion from the gate electrode having negative potential, which considerably reduces the number of the electrons 51 before the electron 51 reaches the PN junction. Thus, the characteristics as shown in FIG. 8 are considered to be obtained. Based on this finding, the gate length of the memory device is preferably 0.5 µm or less. As described before, this memory device is particularly suitable for miniaturization. However, with the gate length being 0.015 µm or less, transistor operation itself becomes difficult. In view of these, it is preferable that the gate length of the memory device is 0.015 µm or more and 0.5 my or less.

Although in the above operation method, two-bit write and erase operation per transistor is achieved by reversing the source electrode and the drain electrode, it is also possible to fix the source electrode and the drain electrode to operate the memory device as one-bit memory. In this case, it becomes possible to set the voltage of either one of the source and drain regions to be a common fixed voltage, which enables reduction of the number of bit lines connected to the source/drain region.

It is understood that the above operation method is applicable not only to the semiconductor storage device of the present embodiment but also to the semiconductor storage devices of other embodiments.

According to the semiconductor storage device of the present embodiment, the charge holding portion of the memory transistor is formed on the both sides of the gate electrode independently of the gate insulating film. This makes it possible to execute two-bit operation. Further, since each of the charge holding portion is separated by the gate electrode, interruption in rewrite operation is effectively controlled. Also, the memory function implemented by the charge holding portion and the transistor operation function implemented by the gate insulating film are separated, decreasing the thickness of the gate insulating film enables restraint of short channel effect. Consequently, it becomes possible to miniaturize the device.

Also, according to the second erase method of the semiconductor storage device, it becomes possible to generate positive holes with relatively low voltage and to execute erase operation. This makes it possible to reduce operating voltage of the memory device. Consequently, reduced power consumption and controlled deterioration of the memory device may be fulfilled. Further, in the memory device of the present invention whose memory effect is increased by offsetting the diffusion layer region from the gate electrode, the second erase method has particularly large effect of decreasing erase operation voltage.

(Second Embodiment)

Figure 9:
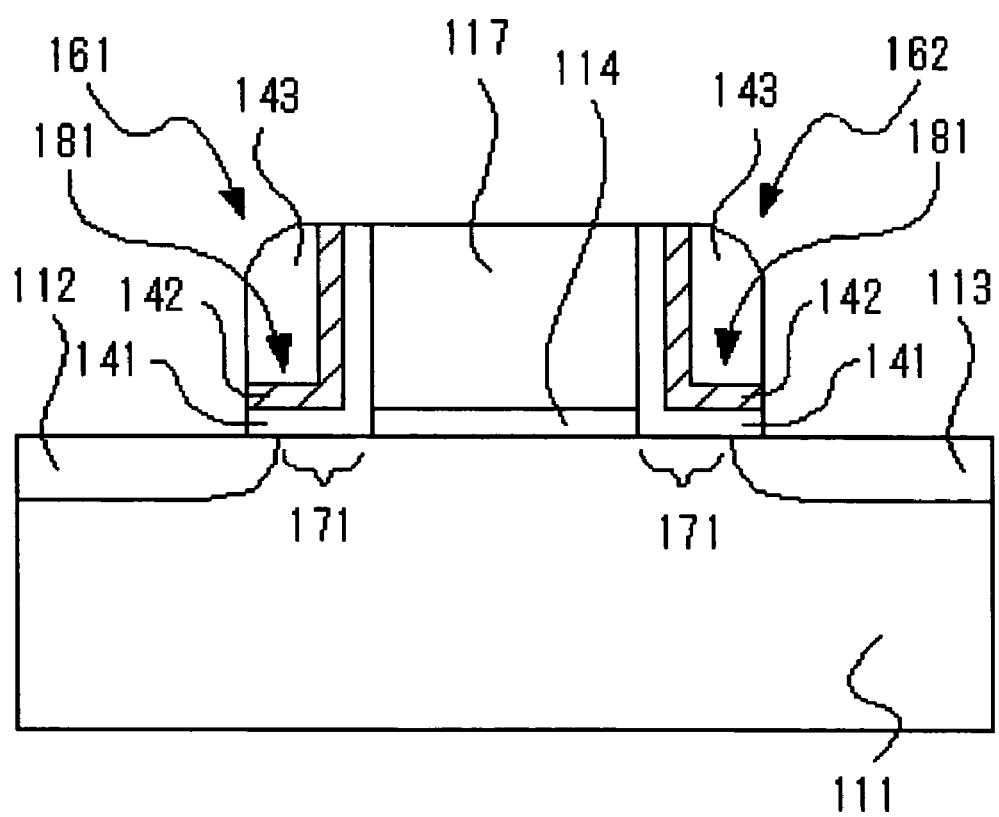
FIG. 9 is an outlined cross sectional view showing main part of the semiconductor storage device in a second embodiment of the present invention.

In a semiconductor storage device in this embodiment as shown in FIG. 9, charge holding portions 161, 162 are composed of a region for holding electric charges (the region for storing electric charges, which may be a film having a function of holding electric charges) and a region for obstructing release of electric charges (which may be a film having a function of obstructing release of electric charges). The semiconductor storage device has, for example, ONO structure. More specifically, the charge holding portions 161, 162 are structured in the state that a film 142 as a first insulator made of silicon nitride being interposed in between a film 141 as a second insulator made of a silicon oxide and a film 143 as a third insulator made of silicon oxide. Here, the silicon nitride film 142 implements a function of storing and holding electric charges. The silicon oxide films 141, 143 implement a function of obstructing release of the electric charges stored in the silicon nitride film.

Also, the region (silicon nitride film 142) for holding electric charges in the charge holding portions 161, 162 are overlapped with the diffusion layer regions 112, 113. Herein, the term "overlap" is used to refer to the state that at least part of the region (silicon nitride film 142) for holding electric charges is present on at least part of the diffusion layer regions 112, 113. It is noted that there are shown a semiconductor substrate 111, a gate insulating film 114, a gate electrode 117, and an offset region 171 (between the gate electrode and the diffusion layer region). Though unshown in the drawing, the uppermost surface of the semiconductor substrate 111 under the gate insulating film 114 is a channel region.

Description will be given of an effect of overlapping the region 142 for holding electric charges in the charge holding portions 161, 162 and the diffusion layer regions 112, 113.

Figure 10:
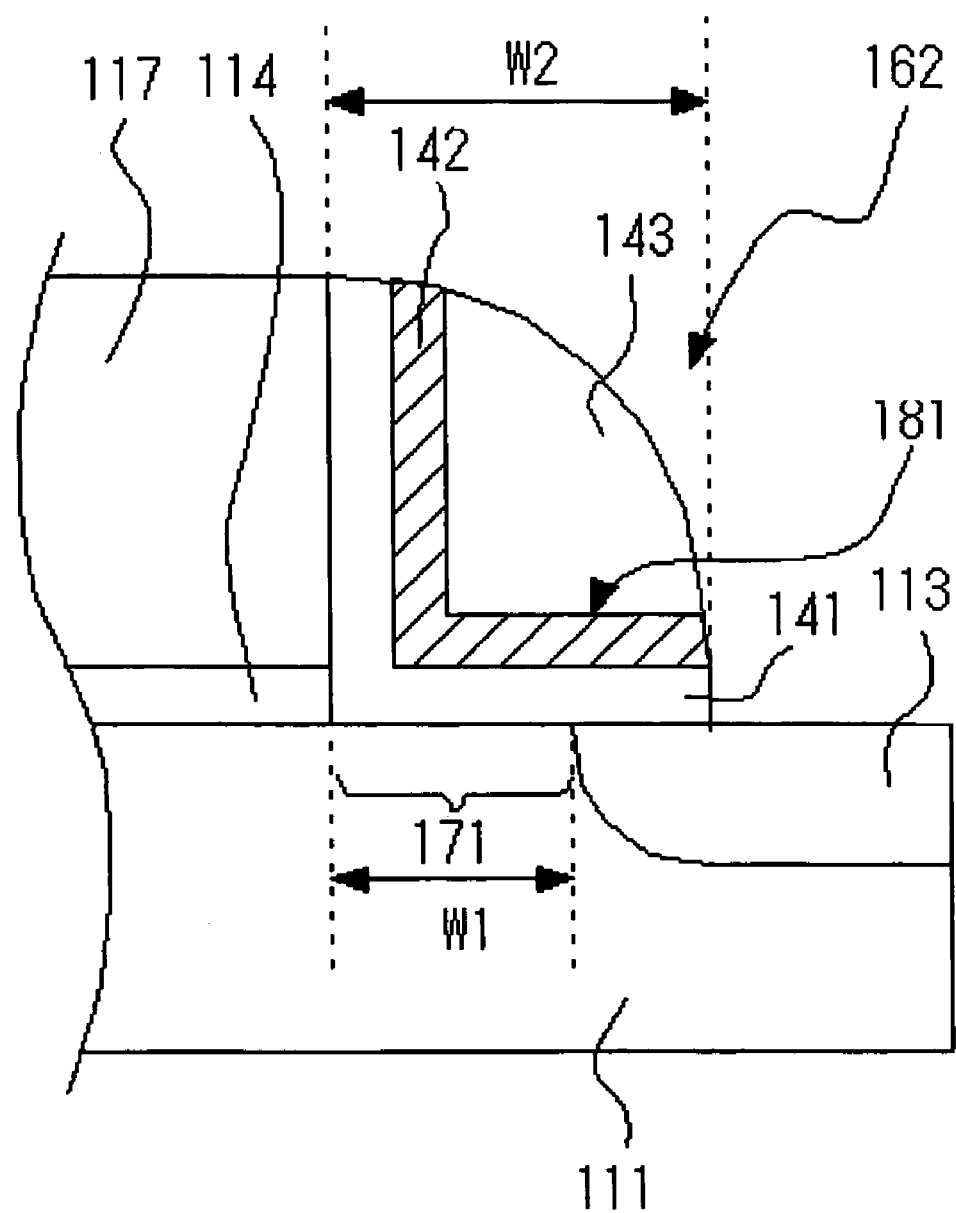
FIG. 10 is an outlined cross sectional view showing enlarged main part of the semiconductor storage device of FIG. 9.

FIG. 10 is an enlarged view showing the vicinity of the charge holding portion 162 that is on the right side of FIG. 9. Reference numeral W1 denotes an offset amount between the gate insulating film 114 and the diffusion layer region 113. Also, reference numeral W2 denotes the width of the charge holding portion 162 on the cross sectional plane in channel length direction of the gate electrode. Since an edge of the silicon nitride film 142 on the side away from the gate electrode 117 in the charge holding portion 162 is aligned with an edge of the charge holding portion 162 on the side away from the gate electrode 117, the width of the charge holding portion 162 is defined as W2. An overlap amount between the charge holding portion 162 and the diffusion layer region 113 is represented by an equation W2−W1. What is particularly important is that the silicon nitride film 142 in the charge holding portion 162 is overlapped with the diffusion layer region 113, that is, the relation of W2>W1 is satisfied.

Figure 11:
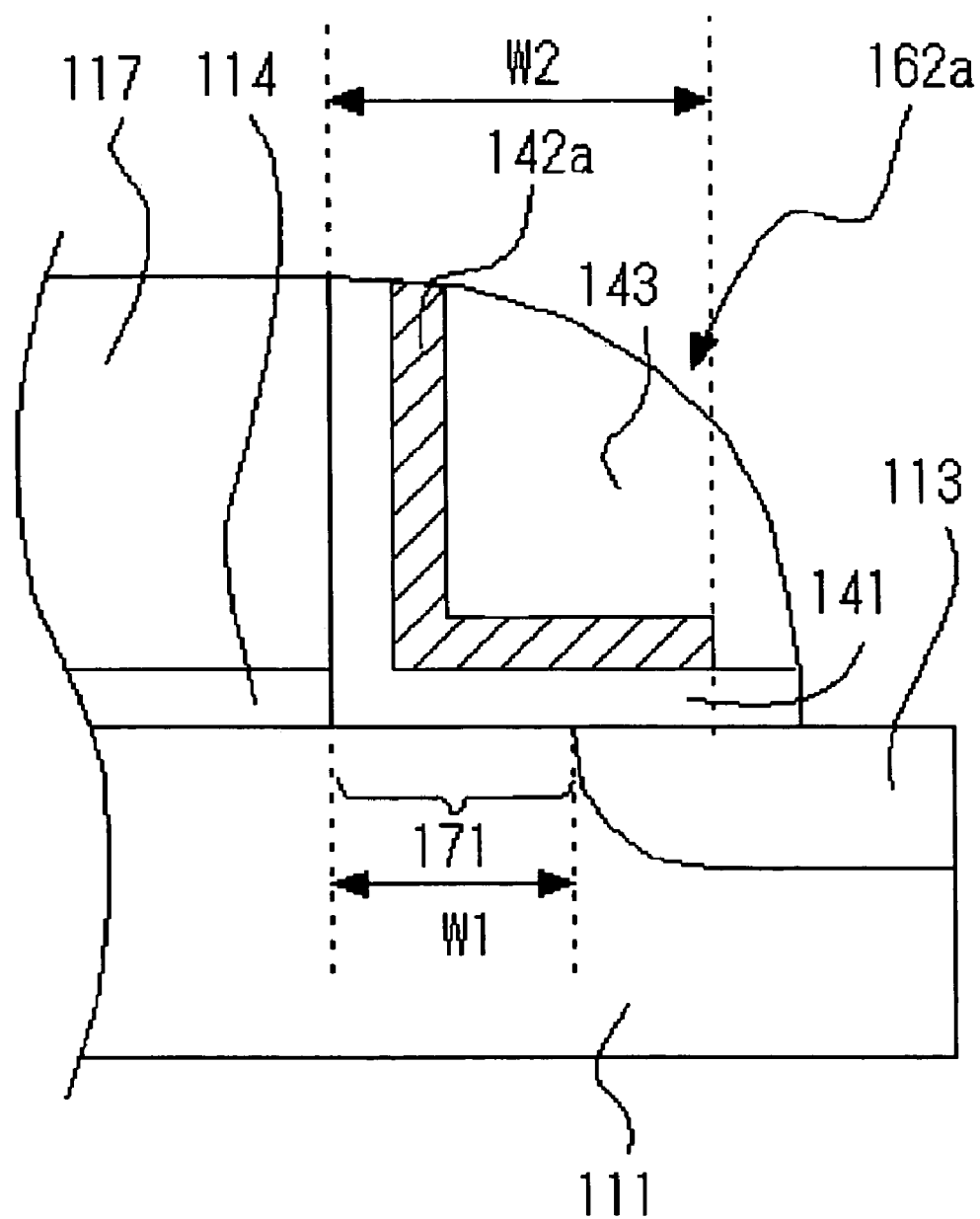
FIG. 11 is an outlined cross sectional view showing enlarged main part of a modified example of the semiconductor storage device of FIG. 9.

In the case where an edge of a silicon nitride film 142a on the side away from the gate electrode in a charge holding portion 162a is not aligned with an edge of the charge holding portion 162a on the side away from the gate electrode as shown in FIG. 11, W2 may be defined as the width from the edge of the gate electrode to the edge of the silicon nitride film 142a on the side away from the gate electrode.

Figure 12:
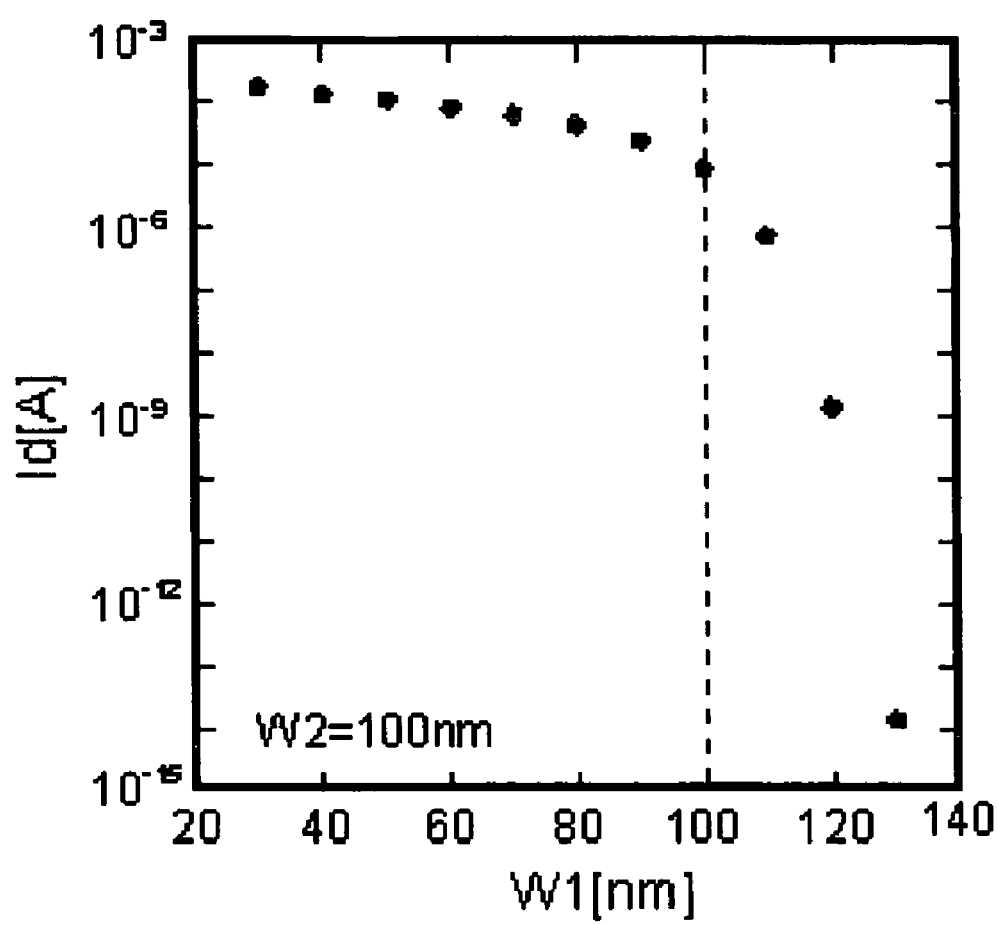
FIG. 12 is a graph showing electric characteristics of the semiconductor storage device in the second embodiment of the present invention.

FIG. 12 shows a drain current Id in the structure of FIG. 10 with the width W2 of the charge holding portion 162 being fixed to 100 nm and the offset amount W1 being varied. Herein, the drain current is obtained by device simulation performed under the conditions that the charge holding portion 162 is in erase state (positive holes are stored), and the diffusion layer regions 112, 113 are set to be a source electrode and a drain electrode, respectively.

As shown in FIG. 12, with W1 being 100 nm or more (i.e., when the silicon nitride film 142 and the diffusion layer region 113 are not overlapped), the drain current shows rapid reduction. Since a drain current value is almost in proportion to a read operation speed, memory performance is rapidly deteriorated when W1 is 100 nm or more. In the range where the silicon nitride film 142 and the diffusion layer region 113 are overlapped, the drain current shows mild reduction. Therefore, it is preferable that at least part of the silicon nitride film 142 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 142 is overlapped with the diffusion layer regions 112, 113 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

In the semiconductor storage device in FIG. 9 to FIG. 11, it is preferable for reading information stored in the charge holding portion 161 (region 181) to set the diffusion layer region 112 as a source electrode and the diffusion layer region 113 as a drain region similar to the embodiment 1 and to form a pinchoff point on the side closer to the drain region in the channel region. More specifically, in reading information stored in either one of two charge holding portions, the pinchoff point is preferably formed in a region closer to the other charge holding portion in the channel region. This makes it possible to detect memory information in the charge holding portion 161 with good sensitivity regardless of the storage condition of the charge holding portion 162, resulting in large contribution to implementation of two-bit operation.

In the case of storing information only in one side out of the two charge holding portions 161, 162, or in the case of using these two charge holding portions 161, 162 in the same storing condition, an pinchoff point is not necessarily formed in read operation.

Although not shown in FIG. 9, a well region (P type well in the case of N-channel device) is preferably formed on the surface of the semiconductor substrate 111. Forming the well region facilitates control of other electric characteristics (withstand voltage, junction capacitance, and short channel effect) while maintaining impurity concentration of the channel region optimum for memory operation (rewrite operation and read operation).

From the viewpoint of improving memory holding characteristic, the charge holding portion preferably contains a charge holding film having a function of holing electric charges and an insulating film. In this embodiment, there are used a silicon nitride film 142 as a charge holding film having levels for trapping electric charges, and silicon oxide films 141, 143 as insulating films having a function of preventing the electric charges stored in the charge holding film from dispersing. The charge holding portion containing the charge holding film and the insulating film makes it possible to prevent electric charges from dispersing and to improve holding characteristic. Further, compared to the charge holding portion composed of only a charge holding film, it becomes possible to appropriately decrease the volume of the charge holding film. Appropriate decrease of the volume of the charge holding film makes it possible to restrain movement of electric charges in the charge holding film and to control occurrence of characteristic change due to movement of electric charges during memory holding.

Figure 13:
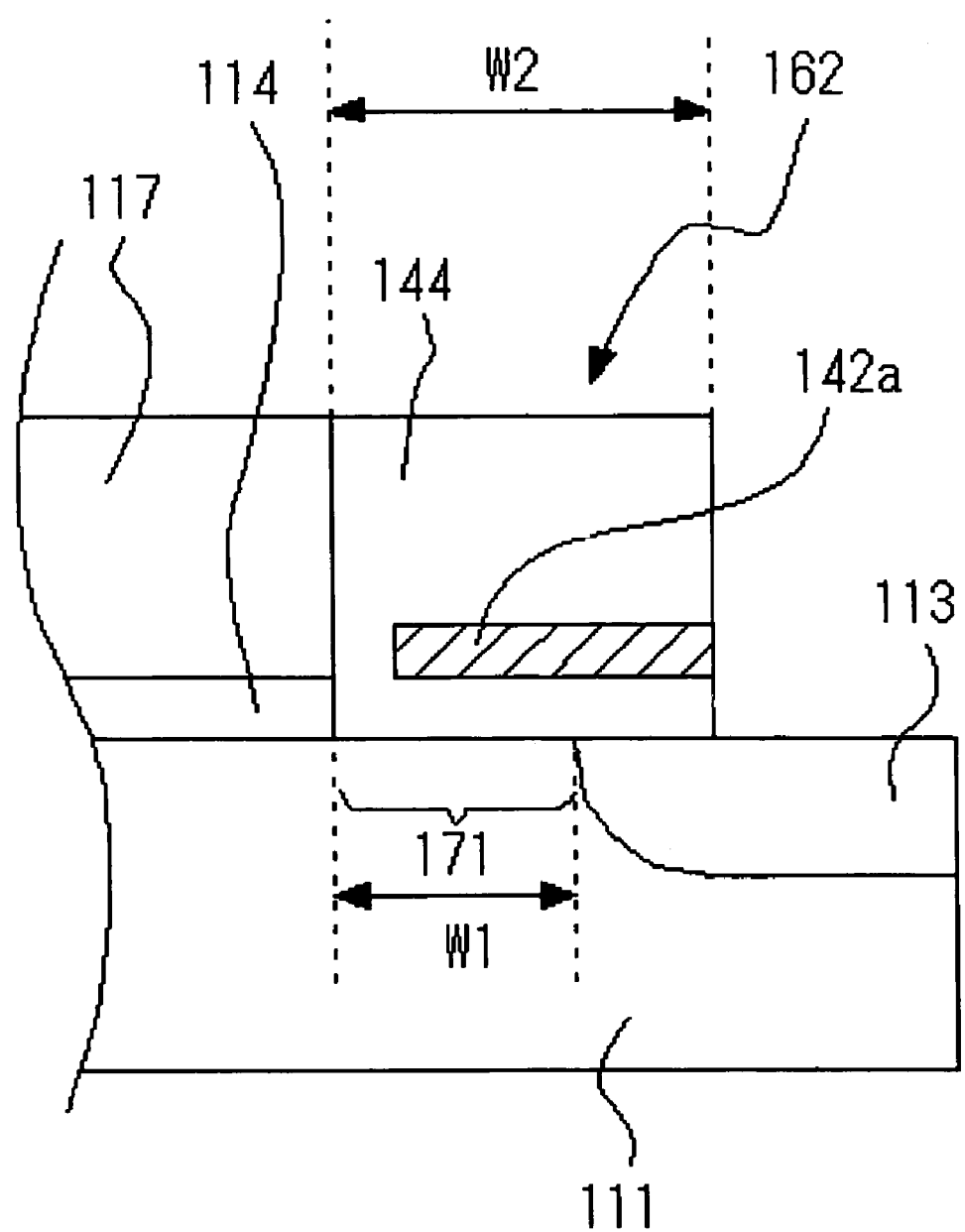
FIG. 13 is an outlined cross sectional view showing main part of a modified example of the semiconductor storage device in the second embodiment of the present invention.

Also, it is preferable that the charge holding portion contains a charge holding film disposed approximately parallel to the surface of the gate insulating film. In other words, it is preferable that the surface of the charge holding film in the charge holding portion is disposed so as to have a constant distance from the surface of the gate insulating film. More particularly, as shown in FIG. 13, a charge holding film 142a in the charge holding portion 162 has a face approximately parallel to the surface of the gate insulating film 114. In other words, the charge holding film 142a is preferably formed to have a uniform height from the height corresponding to the surface of the gate insulating film 114. The presence of the charge holding film 142a approximately parallel to the surface of the gate insulating film 114 in the charge holding portion 162 makes it possible to effectively control easiness of formation of an inversion layer in the offset region 171 with use of an amount of electric charges stored in the charge holding film 142a, thereby enabling increase of memory effect. Also, by placing the charge holding film 142a approximately parallel to the surface of the gate insulating film 114, change of memory effect may be kept relatively small even with a dispersed offset amount (W1), enabling restraint of memory effect dispersion. In addition, movement of electric charges toward upper side of the charge holding film 142a may be controlled, and therefore characteristic change due to the movement of electric charges during memory holding may be restrained.

Furthermore, the charge holding portion 162 preferably contains an insulating film (e.g., a portion of the silicon oxide film 144 on the offset region 171) that separates the charge holding film 142a approximately parallel to the surface of the gate insulating film 114 from the channel region (or the well region). This insulating film may restrain dispersion of the electric charges stored in the charge holding film, thereby contributing to obtaining a semiconductor storage device with better holding characteristics.

It is noted that controlling the film thickness of the charge holding film 142a as well as controlling the film thickness of the insulating film under the charge holding film 142a (a portion of the silicon oxide film 144 on the offset region 171) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the charge holding film 142a to the sum of a maximum film thickness of the insulating film under the charge holding film 142a and a maximum film thickness of the charge holding film 142a. Consequently, the concentration of electric line of force generated by the electric charges stored in the charge holding film 142a may be roughly controlled, and therefore dispersion of the degree of memory effect of the memory device may be minimized.

(Third Embodiment)

Figure 14:
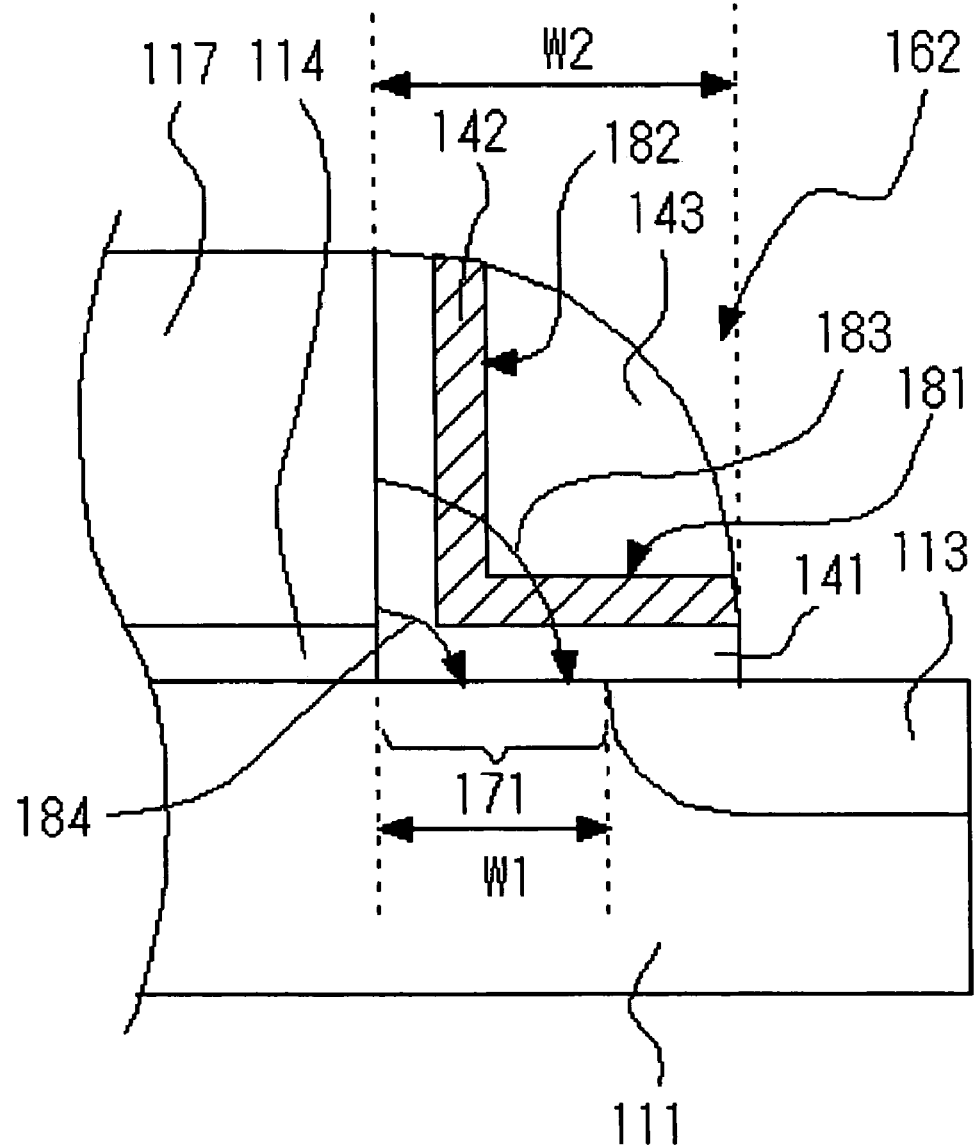
FIG. 14 is an outlined cross sectional view showing main part of the semiconductor storage device in a third embodiment of the present invention.

In this embodiment, a charge holding film 142 as a film made of a first insulator in the charge holding portion 162 has an approximately uniform film thickness as shown in FIG. 14. Further, the charge holding film 142 includes a first portion 181 as a portion having the surface approximately parallel to the surface of the gate insulating film 114 and a second portion 182 as a portion extending in direction approximately parallel to the side face of the gate electrode 117.

When a positive voltage is applied to the gate electrode 117, electric line of force in the charge holding portion 162 passes the silicon nitride film 142 total two times through the first portion 181 and the second portion 182 as shown with an arrow 183. It is noted that when a negative voltage is applied to the gate electrode 117, the direction of electric line of force is reversed. Herein, a dielectric constant of the silicon nitride film 142 is approx. 6, while a dielectric constant of silicon oxide films 141, 143 is approx. 4. Eventually, an effective dielectric constant of the charge holding portion 162 in the direction of electric line of force 183 becomes larger than that in the case where the charge holding film 142 includes only the first portion 181, which makes it possible to decrease potential difference between the both edges of the electric line of force. More specifically, much part of the voltage applied to the gate electrode 117 is used to reinforce electric fields in the offset region 171.

Electric charges are injected into the silicon nitride film 142 in rewrite operation because generated electric charges are pulled by electric fields in the offset region 171. As a consequence, the charge holding film 142 including the second portion 182 increases the electric charges injected into the charge holding portion 162 in rewrite operation, thereby increasing a rewrite speed.

In the case where the portion of the silicon oxide film 143 is a silicon nitride film, more specifically, in the case where the charge holding film is not constant against the height corresponding to the surface of the gate insulating film 114, movement of electric charges toward upper side of the silicon nitride film becomes outstanding, and holding characteristics are deteriorated.

Instead of silicon oxide film, the charge holding portion is more preferably formed from high-dielectric substances such as hafnium oxide having extremely large dielectric constant.

Further, the charge holding portion more preferably includes an insulating film (a portion of the s141 on the offset region 171) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the charge holding portion more preferably includes an insulating film (a portion of the silicon oxide film 141 in contact with the gate electrode 117) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the semiconductor storage device.

Further, similar to the second embodiment, it is preferable that the film thickness of the insulating film under the charge holding film 142 (a portion of the silicon oxide film 141 on the offset region 171) is controlled to be constant, and further the film thickness of the insulating film disposed on the side face of the gate electrode (a portion of the silicon oxide film 141 in contact with the gate electrode 117) is controlled to be constant. Consequently, the concentration of electric line of force generated by the electric charges stored in the charge holding film 142 may be roughly controlled, and leakage of electric charges may be prevented.

(Fourth Embodiment)

This embodiment relates to optimization of the distance between a gate electrode, a charge holding portion, and a source/drain region.

Figure 15:
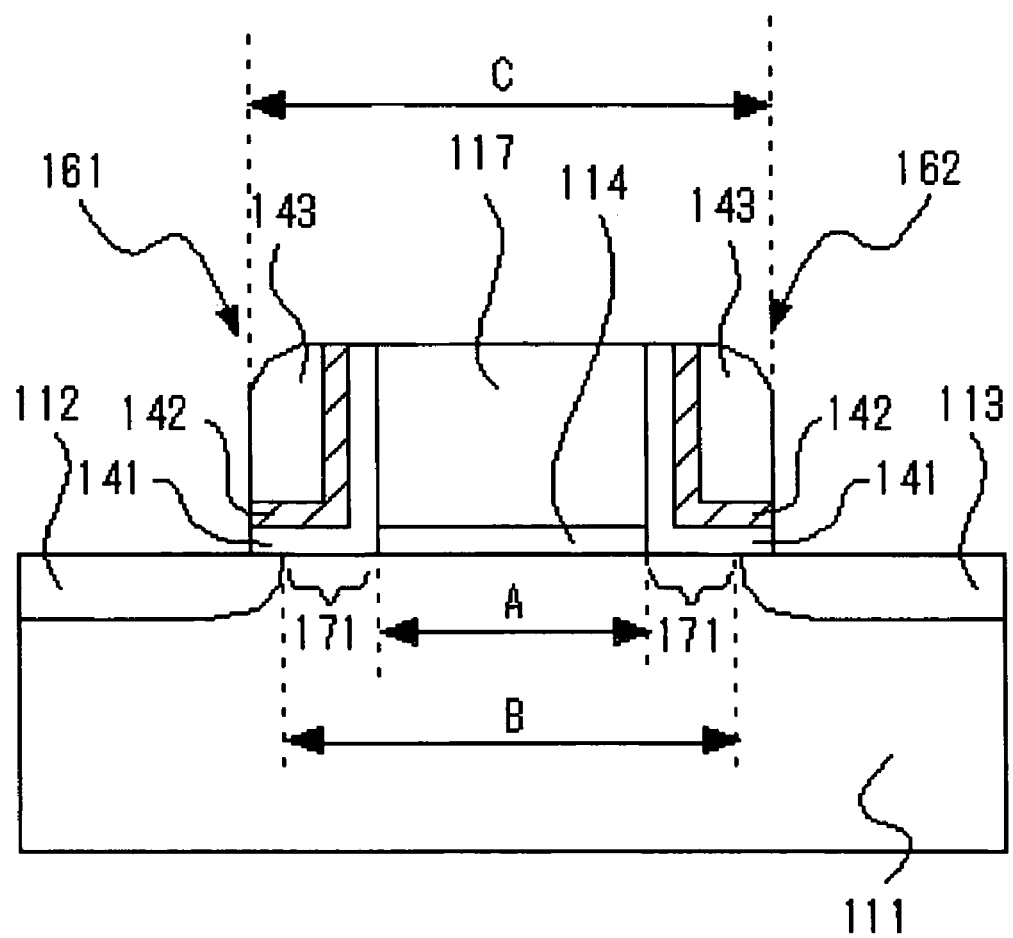
FIG. 15 is an outlined cross sectional view showing main part of the semiconductor storage device in a fourth embodiment of the present invention.

As shown in FIG. 15, reference symbol A denotes a gate electrode length in the cross section in channel length direction, reference symbol B denotes a distance (channel length) between source and drain regions, and reference symbol C denotes a distance from the edge of one charge holding portion 161 to the edge of the other charge holding portion 162, more specifically a distance from the edge of a film 142 (the side away from the gate electrode 117) having a function of holding the electric charges in one charge holding portion 161 in the cross section in channel length direction to the edge of a film 142 (the side away from the gate electrode 117) having a function of holding the electric charges in the other charge holding portion 162.

First, an equation B<C is preferable. In the channel region, there is present an offset region 171 between a portion under the gate electrode 117 and the source/drain regions 112, 113. Since B<C, the electric charges stored in the charge holding portions 161, 162 (silicon nitride film 142) effectively fluctuate easiness of inversion in the entire part of the offset region 171. As a result, memory effect is increased, and high-speed read operation is particularly enabled.

Also, when the gate electrode 117 and the source/drain regions 112, 113 are offset, that is when an equation A<B is satisfied, easiness of inversion of the offset region when a voltage is applied to the gate electrode 117 is largely changed by an electric charge amount stored in the charge holding portions 161, 162. Consequently, memory effect increases and short channel effect can be reduced. However, as long as the memory effect is effective, the offset region is not necessarily required. Even when the offset region 171 is not present, if the impurity concentration in the source/drain regions 112, 113 is sufficiently small, the memory effect can still be effective in the charge holding portions 161, 162 (silicon nitride film 142). Therefore, the state of A<B<C is most preferable.

(Fifth Embodiment)

Figure 16:
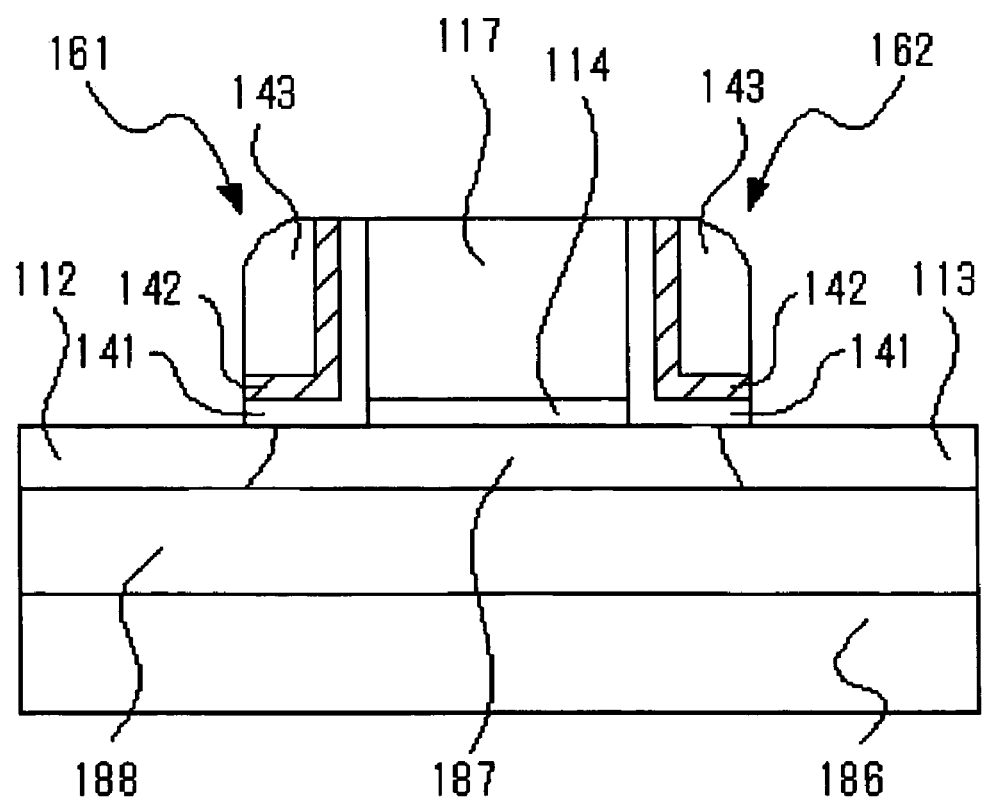
FIG. 16 is an outlined cross sectional view showing main part of the semiconductor storage device in a fifth embodiment of the present invention.

A semiconductor storage device in this embodiment has essentially the same structure as that in the second embodiment except that the semiconductor substrate is SOI substrate as shown in FIG. 16.

The semiconductor storage device is structured such that an embedded oxide film 188 is formed on a semiconductor substrate 186, and on top of the embedded oxide film 188, SOI layer is further formed. In the SOI layer, there are formed diffusion layer regions 112, 113, and other areas constitute a body region 187.

This semiconductor storage device also brings about the working effects similar to those of the semiconductor storage device in the third embodiment. Further, since the junction capacitance between the diffusion layer regions 112, 113 and the body region 187 may be considerably reduced, it becomes possible to increase a device speed and to decrease power consumption.

(Sixth Embodiment)

Figure 17:
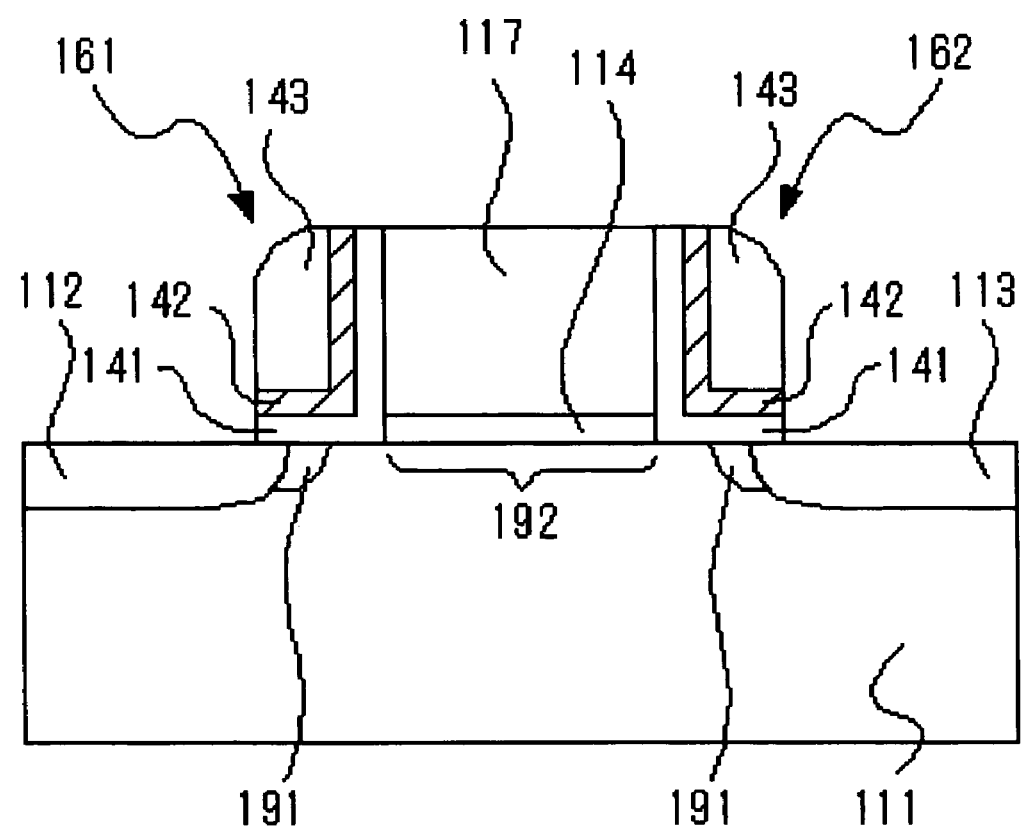
FIG. 17 is an outlined cross sectional view showing main part of the semiconductor storage device in a sixth embodiment of the present invention.

A semiconductor storage device in this embodiment has essentially the same structure as that in the second embodiment except that in the vicinity of the channel side of N type source/drain regions 112, 113, a P type highly-concentrated region 191 is added as shown in FIG. 17.

More specifically, the concentration of P type impurity (e.g., boron) in the P type highly-concentrated region 191 is higher than the concentration of P type impurity in the region 192. An appropriate value of the P type impurity concentration in the P type highly-concentrated region 191 is, for example, around $5 \times 10^{17}$ to $1 \times 10^{19}$ cm$^{-3}$. Also, a value of the P type impurity concentration in the region 192 may be set to, for example, $5 \times 10^{16}$ to $1 \times 10^{18}$ cm$^{-3}$.

Thus, providing the P type highly-concentrated region 191 makes the junction between the diffusion layer regions 112, 113 and the semiconductor substrate 111 steep right under the charge holding portions 161, 162. This facilitates generation of hot carriers in write and erase operation, thereby enabling reduction of voltage in write operation and erase operation or implementing high-speed write operation and erase operation. Further, since the impurity concentration in the region 192 is relatively small, a threshold value when the memory is in erased state is small and so the drain current becomes large. Consequently, a read speed is increased. This makes it possible to provide a semiconductor storage device having low rewrite voltage or a high rewrite speed, and having a high read speed.

Also in FIG. 17, by providing the P type highly-concentrated region 191 in a position adjacent to the source/drain region and on the lower side of the charge holding portions 161, 162 (that is a position not right under the gate electrode), a threshold value of the entire transistor shows considerable increase. The degree of this increase is extremely larger than that in the case where the P type highly-concentrated region 191 is right under the gate electrode 117. When write electric charges (electrons in the case where the transistor is N channel type) are stored in the charge holding portions 161, 162, the difference becomes larger. When enough erase electric charges (positive holes in the case where the transistor is N channel type) are stored in the charge holding portion, a threshold value of the entire transistor is decreased down to a value determined by the impurity concentration in the channel region (region 192) under the gate electrode 117. More specifically, the threshold value in the erased state is not dependent on the impurity concentration in the P type highly-concentrated region 191, whereas the threshold value in the written state receives extremely large influence. Therefore, disposing the P type highly-concentrated region 191 that is under the charge holding portions 161, 162 and adjacent to the source/drain region imparts extremely large fluctuation only to the threshold value in the written state, thereby enabling remarkable increase of memory effect (difference of threshold values in the erased state and the written state).

(Seventh Embodiment)

Figure 18:
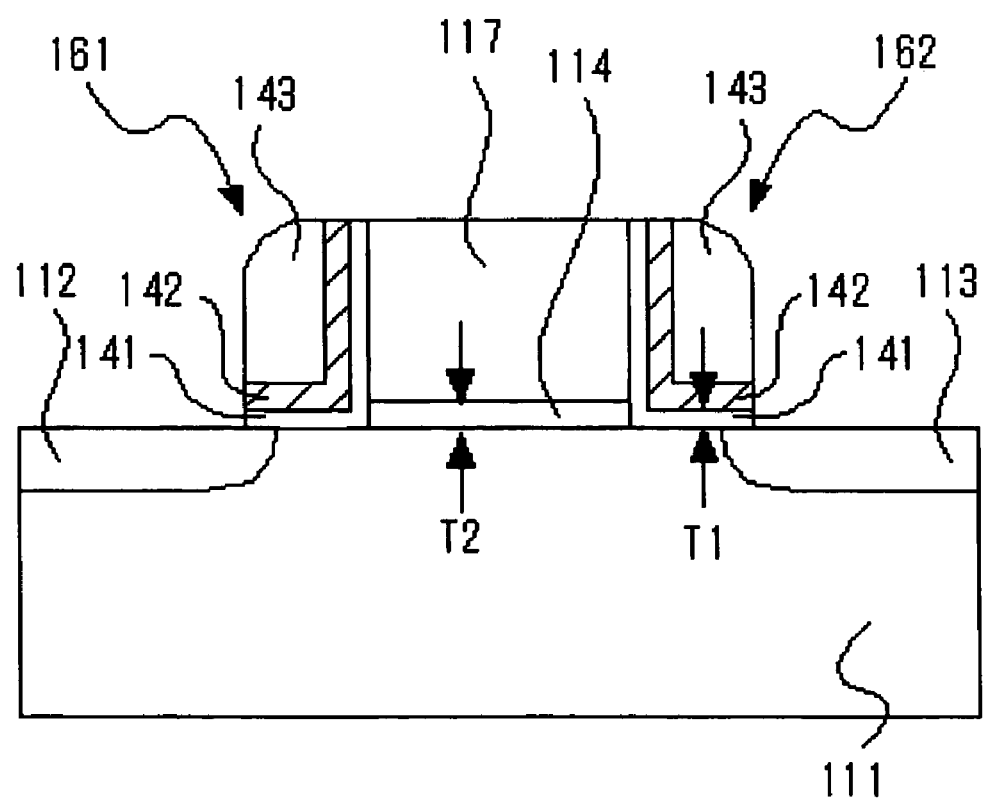
FIG. 18 is an outlined cross sectional view showing main part of the semiconductor storage device in a seventh embodiment of the present invention.

A semiconductor storage device in this embodiment has essentially the same structure as that in the second embodiment except that the thickness T1 of the insulating film 141 that separates the charge holding portion (silicon nitride film 142) from the channel region or the well region is smaller than the thickness T2 of the gate insulating film 114 as shown in FIG. 18.

The gate insulating film 114 has a lower limit of the thickness T2 because of the request for withstand voltage in memory rewrite operation. However, the thickness T1 of the insulating film 141 that separates the charge holding portion (silicon nitride film 142) from the channel region or the well region can be smaller than T2 regardless of the request for withstand voltage.

In the semiconductor storage device in the present embodiment, the thickness T1 of the insulating film has high design freedom as stated above because of the following reason. In the semiconductor storage device in the present embodiment, the insulating film 141 that separates the charge holding film 142 from the channel region or the well region is not interposed in between the gate electrode 117 and the channel region or the well region. Consequently, the insulating film 141 that separates the charge holding film 142 from the channel region or the well region does not receive direct influence from the high-electric fields that affect in between the gate electrode 117 and the channel region or the well region, but receives influence from relatively weak electric fields expanding from the gate electrode 117 in horizontal direction. As a result, despite the request for withstand voltage to the gate insulating film 114, it becomes possible to make T1 smaller than T2. Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory device. As is clear from the above, an essential reason of high freedom of T1 is the fact that the insulating film 141 that separates the charge holding film 142 from the channel region or the well region in the memory device of the present embodiment is not interposed in between the gate electrode 117 and the channel region or the well region.

Decreasing the thickness T1 of the insulating film facilitates injection of electric charges into the charge holding portions 161, 162, decreases voltage for write operation and erase operation, or enables high-speed write operation and erase operation. In addition, since an electric charge amount induced in the channel region or the well region increments when electric charges are stored in the silicon nitride film 142, increased memory effect may be implemented.

Some electric lines of force in the charge holding portion do not pass the silicon nitride film 142 as shown with an arrow 184 in FIG. 14. Since electric field strength is relatively large on such a short electric line of force, the electric fields along the electric line of force plays an important role in rewrite operation. By decreasing the thickness T1 of the insulating film 141, the silicon nitride film 142 moves to the lower side of the FIG. 14, so that the electric line of force shown with the arrow 184 passes the silicon nitride film 142. As a consequence, an effective dielectric constant in the charge holding portion along the electric line of force 184 becomes large, which makes it possible to make potential difference between the both ends of the electric line of force 184 smaller. Therefore, most part of voltage applied to the gate electrode 117 is used to strengthen the electric fields in the offset region, thereby implementing high-speed write operation and erase operation.

As is clear from the above, the thickness T1 of the insulating film 141 that separates the silicon nitride film 142 from the channel region or the well region and the thickness T2 of the gate insulating film 114 are defined as T1<T2 so as to decrease voltage in write operation and erase operation or implement high-speed write operation and erase operation, and to enable further increase of memory effect without degrading withstand voltage capability of the memory.

It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18V voltage is necessary for driving liquid crystal panel TFT. Eventually, it is not possible to make the gate oxide film thinner. In the case of mounting a nonvolatile memory of the present invention as an image adjuster together with other devices on the liquid crystal driver LSI, the memory device of the present invention enables optimum design of the thickness of an insulating film that separates the charge holding film (silicon nitride film 242) from the channel region or the well region independently of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

(Eighth Embodiment)

Figure 19:
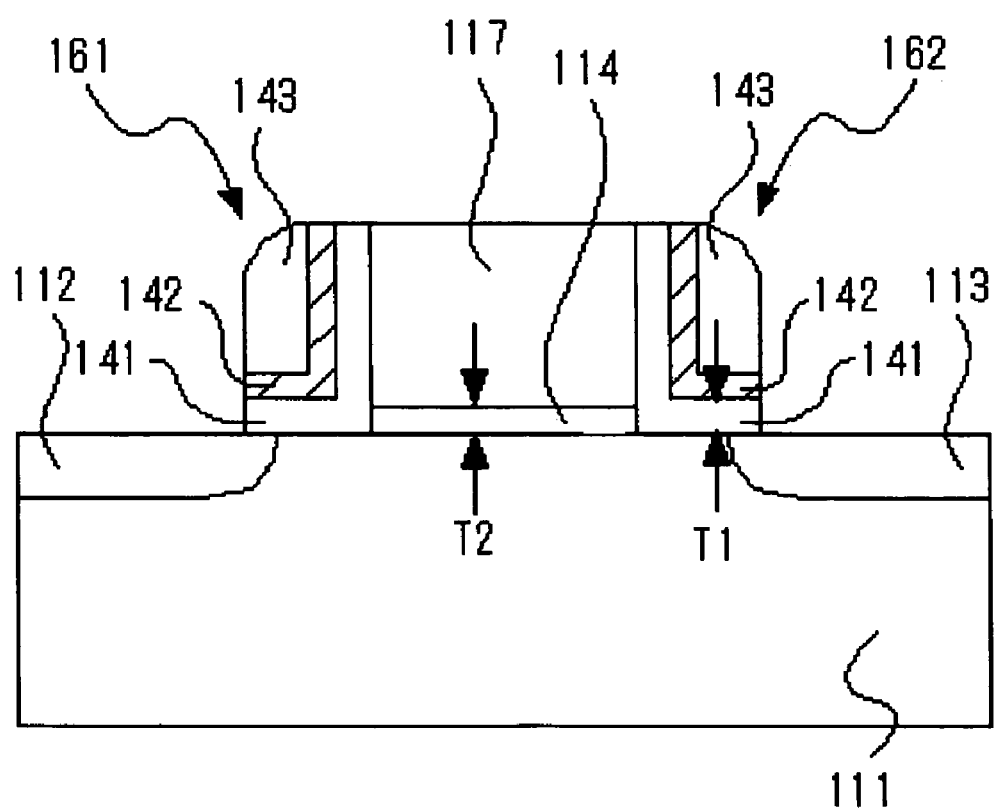
FIG. 19 is an outlined cross sectional view showing main part of the semiconductor storage device in an eighth embodiment of the present invention.

A semiconductor storage device in this embodiment has essentially the same structure as that in the second embodiment except that the thickness T1 of the insulating film 141 that separates the charge holding film (silicon nitride film 142) from the channel region or the well region is larger than the thickness T2 of the gate insulating film 114 as shown in FIG. 19.

The gate insulating film 114 has an upper limit of the thickness T2 because of the request for prevention of short channel effect of the device. However, the thickness T1 of the insulating film 141 on the lower side of the charge holding film 142 can be larger than T2 regardless of the request for prevention of short channel effect. More specifically, as miniaturization scaling proceeds (the gate insulating film 114 becomes smaller), the thickness of the insulating film 141 that separates the charge holding film (silicon nitride film 142) from the channel region or the well region may be optimally designed independently of the thickness T2 of the gate insulating film, which implements the effect that the charge holding portion will not disturb scaling.

In the semiconductor storage device of the present embodiment, the thickness T1 of the insulating film 141 has high design freedom as stated above because, as is already described, the insulating film 141 that separates the charge holding film 142 from the channel region or the well region is not interposed in between the gate electrode 117 and the channel region or the well region. As a result, despite the request for prevention of short channel effect to the gate insulating film 114, it becomes possible to make T1 larger than T2.

Increasing the thickness of the insulating film 141 makes it possible to prevent dispersion of the electric charges stored in the charge holding film 142 and to improve holing characteristics of the memory.

Therefore, setting as T1>T2 enables improvement of holding characteristics without deteriorating short channel effect of the memory.

It is noted that the thickness T1 of the insulating film 141 is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the semiconductor storage device of the present invention, independent designing of T1 and T2 is available as described above, and therefore miniaturization becomes possible. In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode. Also, since the source/drain region is offset from the gate electrode in the semiconductor storage device of the present invention, miniaturization is further facilitated compared to normal logic transistors.

As described above, according to the semiconductor storage device of the present invention, since an electrode for supporting write and erase operation is not present above the charge holding portion, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in horizontal direction. This makes it possible to fulfill a memory cell having the gate length miniaturized more than the gate length of the logic transistors in comparison with the same processing generations.

(Ninth Embodiment)

This embodiment relates to changes of electric characteristics when rewrite operation is performed in the semiconductor storage device of the present invention.

Figure 20:
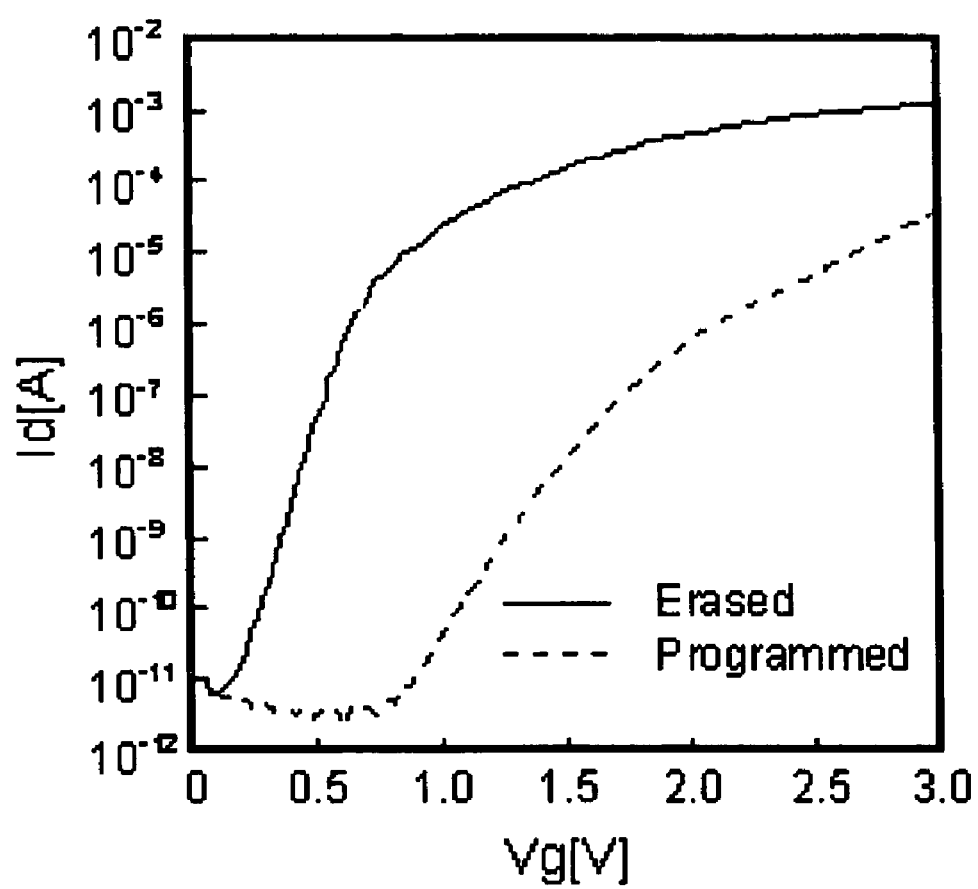
FIG. 20 is a graph showing electric characteristics of the semiconductor storage device in a ninth embodiment of the present invention.
Figure 21:
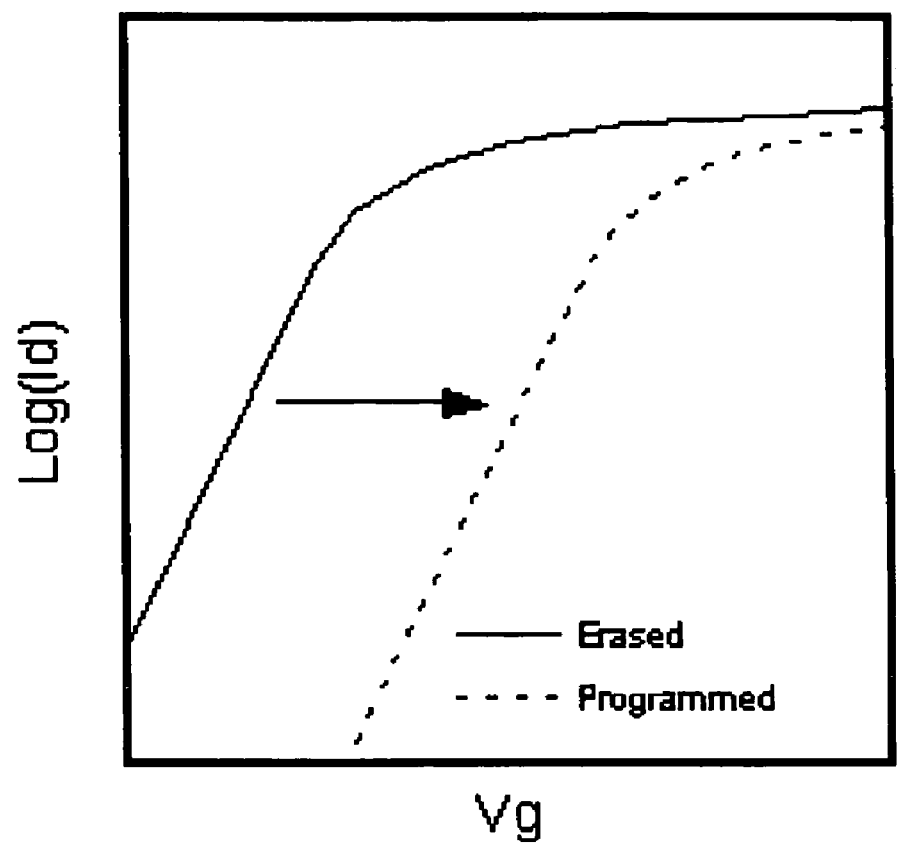
FIG. 21 is a graph showing electric characteristics of a conventional flash memory.
Figure 22:
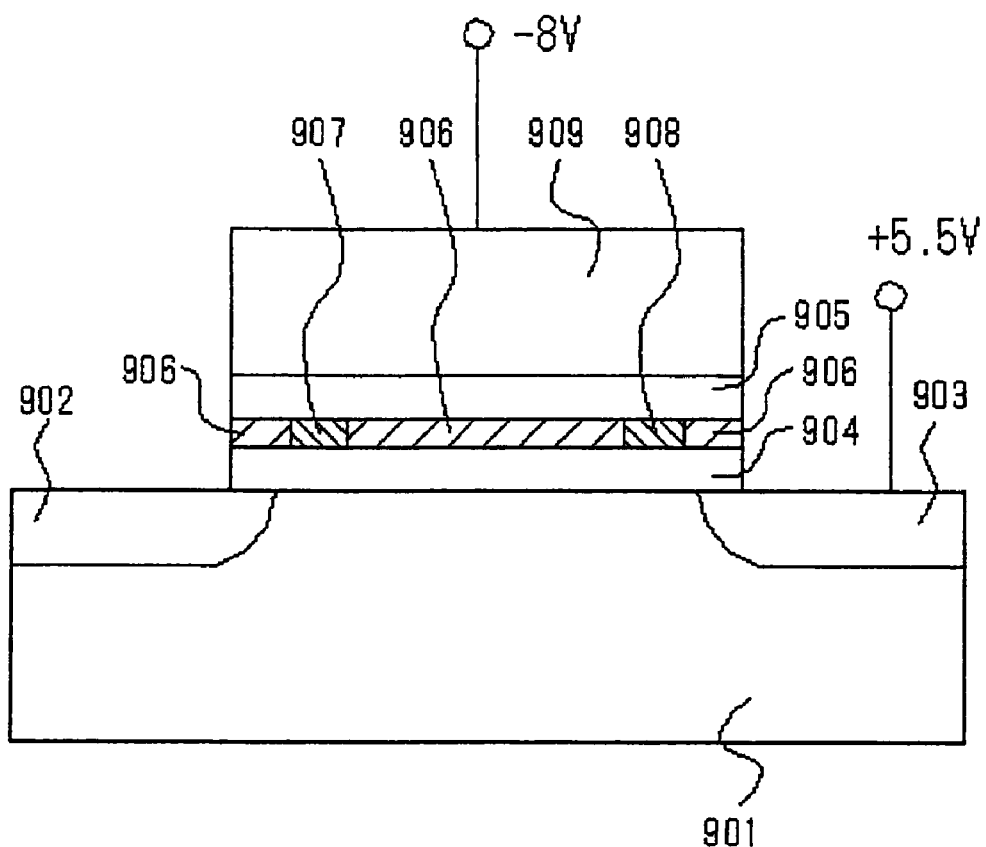
FIG. 22 is an outlined cross sectional view showing main part of a conventional semiconductor storage device.

FIG. 20 is a view showing changes of a drain current Id(A) against a gate voltage Vg(V) in the erased state and written state where an electric charge amount in the charge holding portion of an N-channel type memory device is different, with curve lines, wherein a horizontal axis expresses the gate voltage Vg(V) and a vertical axis expresses the drain current ID(A). As clearly shown in FIG. 20, when write operation is performed in the erased state (solid line), not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5V, the current ratio is still two digits or more. This characteristic is largely different from that in the case of a flash memory shown in FIG. 21. FIG. 21 is a view, similar to FIG. 20, showing changes of a drain current Id(A) against a gate voltage Vg(V) in the erased state and written state in a flash memory, with curved lines.

The emergence of the above characteristic in the semiconductor storage device of the present embodiment is a phenomenon peculiar to the case where the gate electrode and the diffusion region are offset and therefore the gate electric fields are difficult to reach the offset region. When the semiconductor storage device is in the written state, an inversion layer is extremely difficult to be generated in the offset region below the charge holding portion even if a positive voltage is applied to the gate electrode. This causes smaller inclination of the Id-Vg curve line in the sub-threshold region in the written state. When the semiconductor storage device is in the erased state, high-density electrons are induced in the offset region. Further, when 0V is applied to the gate electrode (i.e., in OFF state), electrons are not induced in the channel below the gate electrode (because of which an off current is small). This causes large inclination of the Id-Vg curve line in the sub-threshold region in the erased state and a large increase rate (conductance) even in the region over the threshold.

As is clear from the above description, the semiconductor storage device of the present invention makes it possible to make the drain current ratio of the erased state to the written state particularly large.

The invention claimed is:

1. A semiconductor storage device comprising:
    a first conductivity type semiconductor substrate, a first conductivity type well region provided in a semiconductor substrate, or a first conductivity type semiconductor film disposed on an insulator;
    a gate insulating film formed on the first conductivity type semiconductor substrate, the first conductivity type well region provided in the semiconductor substrate, or the first conductivity type semiconductor film disposed on the insulator;
    a single gate electrode formed on the gate insulating film;
    two charge holding portions formed on sides of side walls of the single gate electrode;
    a channel region disposed under the single gate electrode; and
    second conductivity type diffusion layer regions disposed on both sides of the channel region, wherein
    the charge holding portions are structured so as to change a current amount flowing between one of the second conductivity type diffusion layer regions and the other of the second conductivity type diffusion layer regions when voltage is applied to the gate electrode by an amount of electric charges stored in the charge holding portions,
    a reference voltage is applied to the other of the second conductivity type diffusion layer regions,
    a first voltage is applied to the one of the second conductivity type diffusion layer regions,
    a second voltage is applied to the gate electrode such that carriers are injected into the the charge holding portion existing on the side of the one of the second conductivity type diffusion layer regions,
    the second conductivity type diffusion layer regions are respectively offset relative to edges of the single gate electrode,
    no electrode exists on each of the two charge holding portions, and
    the two charge holding portions are respectively located above part of the channel region and part of each of the second conductivity type diffusion layer regions.

2. The semiconductor storage device as defined in claim 1, wherein
    a third voltage is applied to the first conductivity type semiconductor substrate, the first conductivity type well region provided in the semiconductor substrate, or the first conductivity type semiconductor film disposed on the insulator.

3. The semiconductor storage device as defined in claim 1, wherein
    the first conductivity type is P type,
    the second conductivity type is N type,
    the carriers are positive holes,
    the first voltage is higher than the reference voltage, and
    the second voltage is lower than the reference voltage.

4. The semiconductor storage device as defined in claim 1, wherein
    the first conductivity type is N type,
    the second conductivity type is P type,
    the carriers are electrons,
    the first voltage is lower than the reference voltage, and
    the second voltage is higher than the reference voltage.

5. The semiconductor storage device as defined in claim 1, wherein
    the second conductivity type diffusion layer regions have an offset structure without an overlap region overlapping the gate electrode with interposition of the gate insulating film.

6. The semiconductor storage device as defined in claim 2, wherein
an absolute value of voltage difference between the second voltage and the third voltage is 0.7V or more and 1V or less.

7. The semiconductor storage device as defined in claim 2, wherein
a gate length of the gate electrode is 0.015 μm or more and 0.5 μm or less.

8. The semiconductor storage device as defined in claim 1, wherein
the charge holding portion is composed of a first insulator, a second insulator, and a third insulator,
the charge holding portion has a structure in which a film composed of the first insulator having a function of storing electric charges is interposed between the second insulator and the third insulator,
the first insulator is silicon nitride,
the second and third insulators are silicon oxide.

9. The semiconductor storage device as defined in claim 8, wherein
a thickness of the film composed of the second insulator on the channel region is smaller than a thickness of the gate insulating film and is 0.8 nm or more.

10. The semiconductor storage device as defined in claim 8, wherein
a thickness of the film composed of the second insulator on the channel region is larger than a thickness of the gate insulating film and is 20 nm or less.

11. The semiconductor storage device as defined in claim 8, wherein
the film composed of the first insulator having a function of storing electric charges includes a portion having a surface that is approximately parallel to a surface of the gate insulating film.

12. The semiconductor storage device as defined in claim 11, wherein
the film composed of the first insulator having a function of storing electric charges includes a portion extending in direction approximately parallel to a lateral side of the gate electrode.

13. The semiconductor storage device as defined in claim 1, wherein
at least part of the charge holding portion is formed so as to overlap part of the second conductivity type diffusion layer region.

14. The semiconductor storage device as defined in claim 2, wherein
the first conductivity type is P type,
the second conductivity type is N type,
the carriers are positive holes,
the first voltage is higher than the reference voltage,
the second voltage is lower than the reference voltage, and
the third voltage is higher than the reference voltage.

15. The semiconductor storage device as defined in claim 2, wherein
the first conductivity type is N type,
the second conductivity type is P type,
the carriers are electrons,
the first voltage is lower than the reference voltage,
the second voltage is higher than the reference voltage, and
the third voltage is lower than the reference voltage.

16. The semiconductor storage device as defined in claim 15, wherein
an absolute value of voltage difference between the second voltage and the third voltage is 0.7V or more and 1V or less.

17. A semiconductor storage device comprising:
a first conductivity type semiconductor substrate, a first conductivity type well region provided in a semiconductor substrate, or a first conductivity semiconductor film disposed on an insulator;
a gate insulating film formed on the first conductivity type semiconductor substrate, the first conductivity well region provided in the semiconductor substrate, or the first conductivity type semiconductor film disposed on the insulator;
a single gate electrode formed on the gate insulating film;
two charge holding portions formed on sides of side walls of the single gate electrode;
a channel region disposed under the single gate electrode; and
second conductivity type diffusion layer regions disposed on both sides of the channel region, wherein
the charge holding portions are structured so as to change a current amount flowing between one of the second conductivity type diffusion layer regions and the other of the second conductivity type diffusion layer regions when voltage is applied to the gate electrode by an amount of electric charges stored in the charge holding portions,
a reference voltage is applied to the other of the second conductivity type diffusion layer regions,
a first voltage is applied to the one of the second conductivity type diffusion layer regions,
a second voltage is applied to the gate electrode such that carriers are injected into the charge holding portion existing on the side of the one of the second conductivity type diffusion layer regions,
a third voltage is applied to the first conductivity type semiconductor substrate,
the first conductivity type well region provided in the semiconductor substrate, of the first
conductivity type semiconductor film disposed on the insulator,
the first conductivity type is P type,
the second conductivity type is N type,
the carriers are positive holes,
the first voltage is higher than the reference voltage,
the second voltage is lower than the reference voltage, and
the third voltage is higher than the reference voltage.

18. A semiconductor storage device comprising:
a first conductivity type semiconductor substrate, a first conductivity type well region provided in a semiconductor substrate, or a first conductivity type semiconductor film disposed on an insulator;
a gate insulating film formed on the first conductivity type semiconductor substrate, the first conductivity type well region provided in the semiconductor substrate, or the first conductivity type semiconductor film disposed on the insulator;
a single gate electrode formed on the gate insulating film;
two charge holding portions formed on sides of side walls of the single gate electrode;
a channel region disposed under the single gate electrode; and
second conductivity type diffusion layer regions disposed on both sides of the channel region, wherein the charge holding portions are structured so as to change a current amount flowing between one of the second conductivity type diffusion layer regions and the other of the second conductivity type diffusion layer regions when voltage is applied to the gate electrode by an amount of electric charges stored in the charge holding portions, wherein a reference voltage is applied to the other of the second conductivity type diffusion layer regions, a first voltage is applied to the one of the second conductivity type diffusion layer regions, a second voltage is applied to the gate electrode such that carriers are injected into the charge holding portion existing on the side of the one of the second conductivity type diffusion layer regions, a third voltage is applied to the first conductivity type semiconductor substrate, the first conductivity type well region provided in the semiconductor substrate, or the first conductivity type semiconductor film disposed on the insulator, the first conductivity type is N type, the second conductivity type is P type, the carriers are electrons, the first voltage is lower than the reference voltage, the second voltage is higher than the reference voltage, and the third voltage is lower than the reference voltage.

* * * * *